United States Patent
Fujishiro et al.

(10) Patent No.: US 7,224,846 B2
(45) Date of Patent: May 29, 2007

(54) IMAGE CODING APPARATUS AND METHOD, AND PROGRAM AND RECORDING MEDIUM

(75) Inventors: Shigeo Fujishiro, Tokyo (JP); Takuya Kitamura, Tokyo (JP)

(73) Assignee: Sony Corporation, Tokyo (JP)

( * ) Notice: Subject to any disclaimer, the term of this patent is extended or adjusted under 35 U.S.C. 154(b) by 739 days.

(21) Appl. No.: 10/625,520

(22) Filed: Jul. 24, 2003

(65) Prior Publication Data

US 2004/0228539 A1 Nov. 18, 2004

(30) Foreign Application Priority Data

Aug. 14, 2002 (JP) ............................. 2002-236620

(51) Int. Cl.
*G06K 9/36* (2006.01)
(52) U.S. Cl. .................... 382/240; 382/232; 382/233; 382/247
(58) Field of Classification Search ................ 382/232, 382/240, 244, 248, 239, 233; 375/240.16, 375/240.29; 348/416.1, 699, 629
See application file for complete search history.

(56) References Cited

U.S. PATENT DOCUMENTS 6,229,927 B1 * 5/2001 Schwartz .................. 382/248
6,549,666 B1 * 4/2003 Schwartz .................. 382/233
6,990,247 B2 * 1/2006 Schwartz .................. 382/240

\* cited by examiner

*Primary Examiner*—Anh Hong Do
(74) *Attorney, Agent, or Firm*—Oblon, Spivak, McClelland, Maier & Neustadt, P.C.

(57) ABSTRACT

An bit-plane coding pass generator is provided in which for SP-pass processing quantization coefficient of each code block divided into bit planes, "significant (S)" or "non-significant (N)" data in a predetermined area and those around the area and compared with an S/N matching pattern. The S/N matching pattern has been set when a jump can be made from an arbitrary sample point to a next sample point to be processed by SP pass. The jump is made to the next sample point to be processed by SP pass according to a jump address value obtained from a pattern coincident with a current S/N matching pattern. Thus, by reducing the time for the significant propagation (SP) pass defined in JPEG-2000, a code block can be coded at a higher speed by three coding passes.

14 Claims, 20 Drawing Sheets

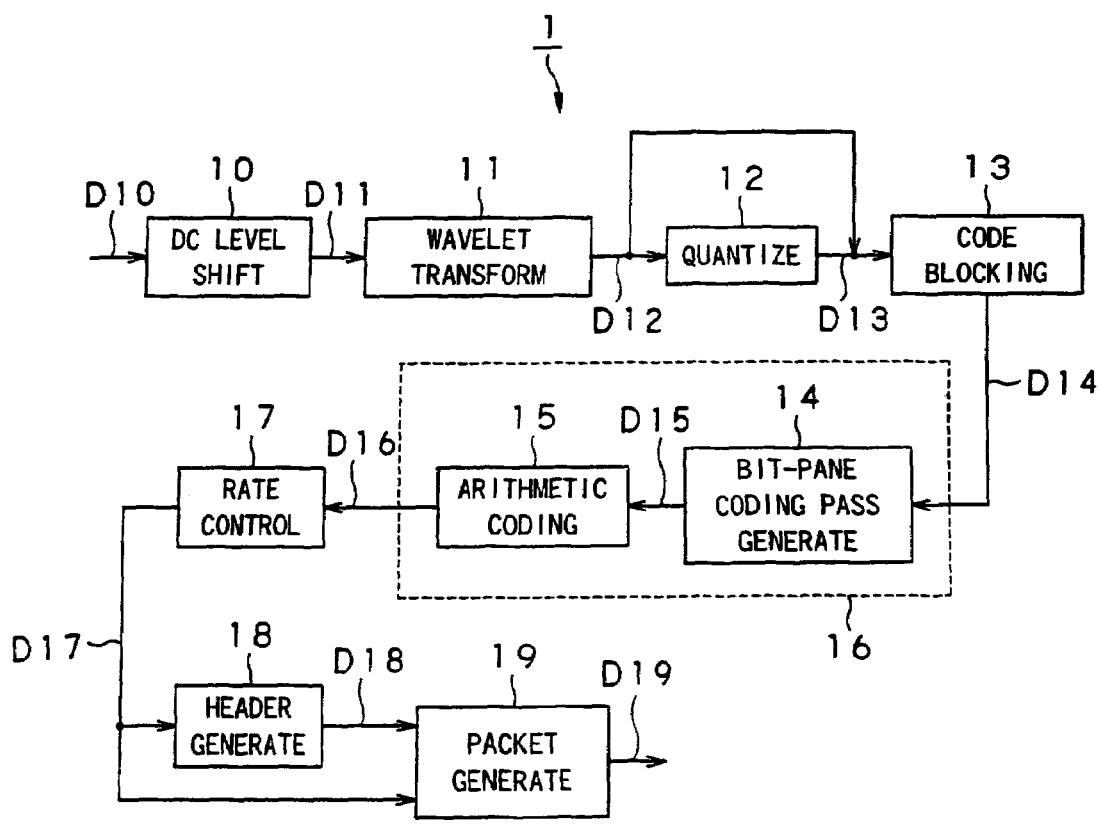

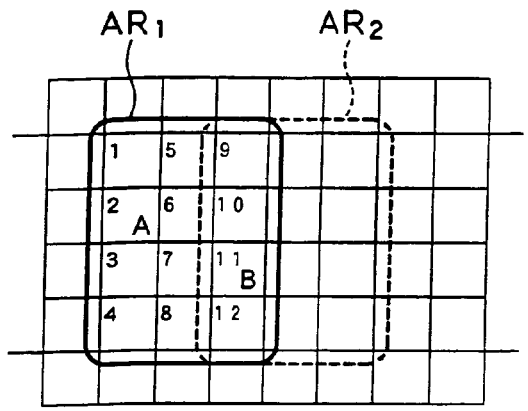 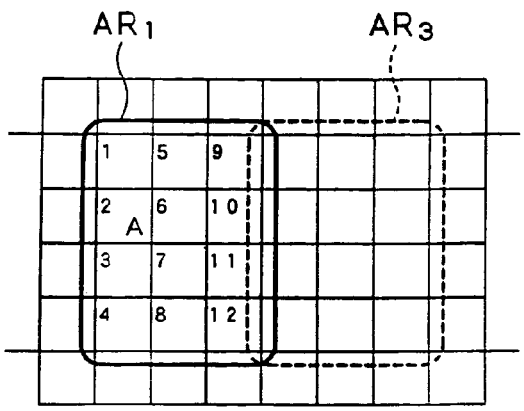
FIG.11A  FIG.11B
FIG. 11
| | | NEXT SAMPLE POINT POSITION | | | | | | | | | | | |
|---|---|---|---|---|---|---|---|---|---|---|---|---|---|
| | | 1 | 2 | 3 | 4 | 5 | 6 | 7 | 8 | 9 | 10 | 11 | 12 |
| CURRENT SAMPLE POINT POSITION | 1 | | 1 | 2 | 3 | 4 | 5 | 6 | 7 | 8 | 9 | 10 | 11 |
| | 2 | | | 1 | 2 | 3 | 4 | 5 | 6 | 7 | 8 | 9 | 10 |
| | 3 | | | | 1 | 2 | 3 | 4 | 5 | 6 | 7 | 8 | 9 |
| | 4 | | | | | 1 | 2 | 3 | 4 | 5 | 6 | 7 | 8 |
| | 5 | | | | | | 1 | 2 | 3 | 4 | 5 | 6 | 7 |
| | 6 | | | | | | | 1 | 2 | 3 | 4 | 5 | 6 |
| | 7 | | | | | | | | 1 | 2 | 3 | 4 | 5 |
| | 8 | | | | | | | | | 1 | 2 | 3 | 4 |
| | 9 | | | | | | | | | | 1 | 2 | 3 |
| | 10 | | | | | | | | | | | 1 | 2 |
| | 11 | | | | | | | | | | | | 1 |
| | 12 | | | | | | | | | | | | |
FIG.12

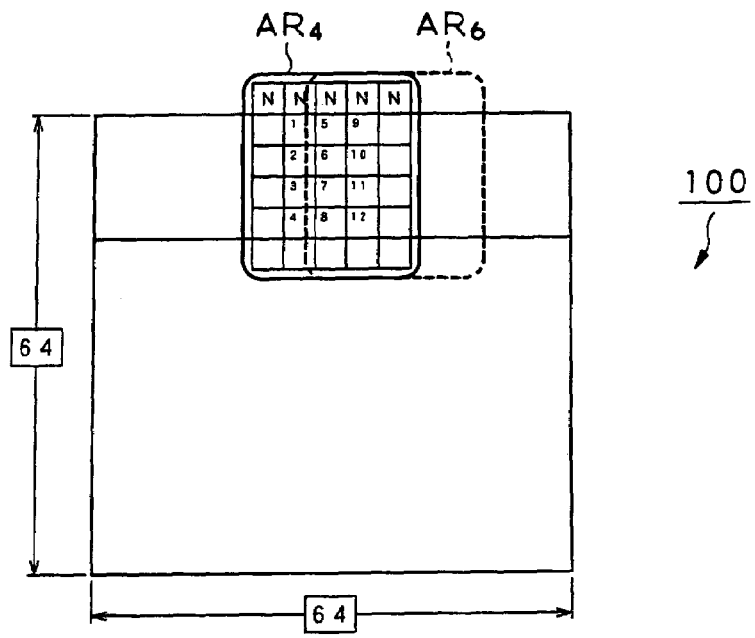
FIG. 14A
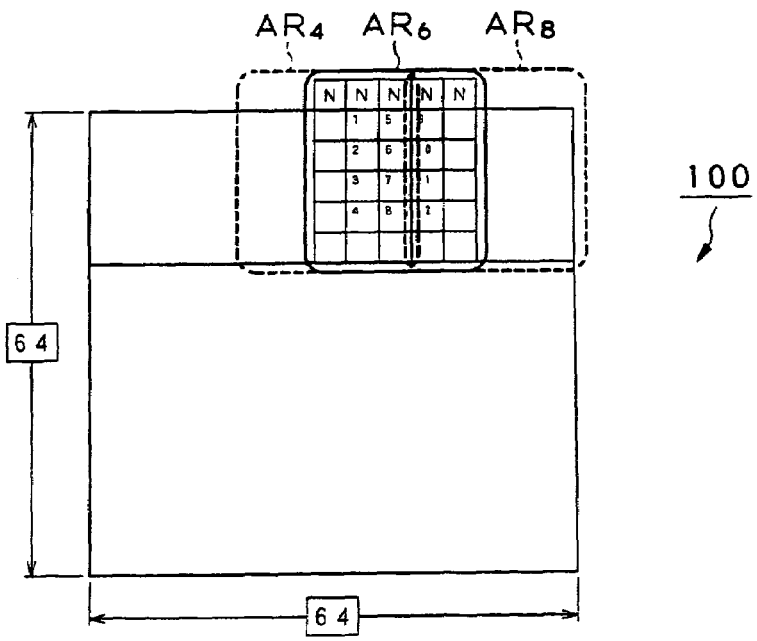
FIG. 14B
FIG. 14

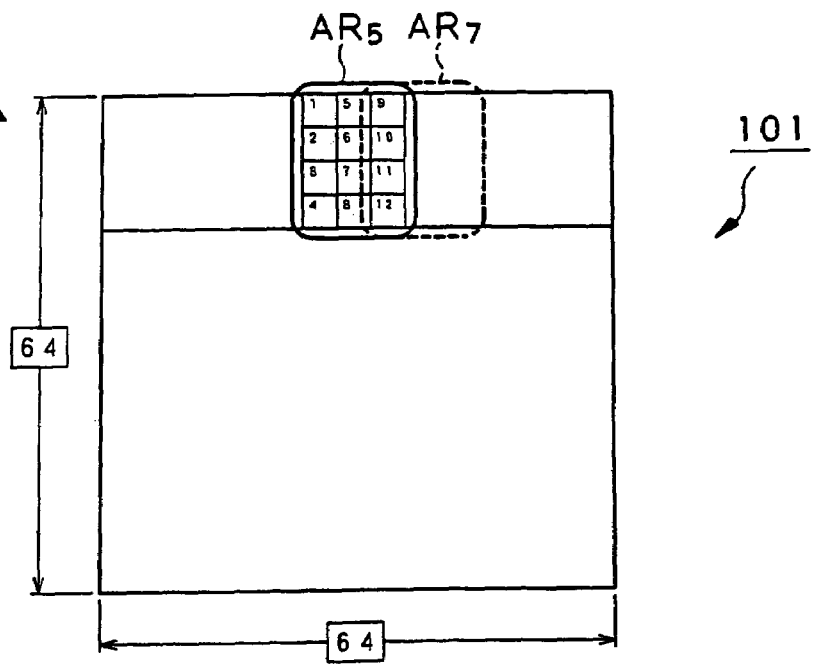
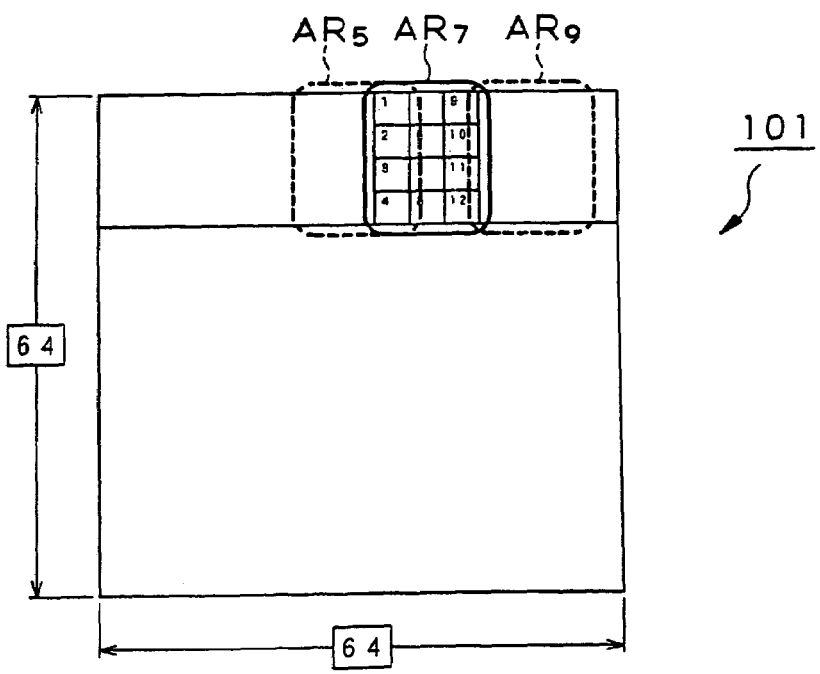
FIG. 15

FIG.17

FIG.19
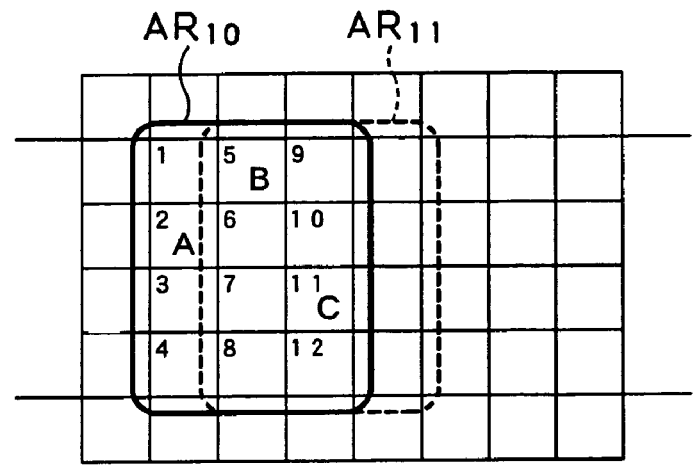
FIG.20A
FIG. 20
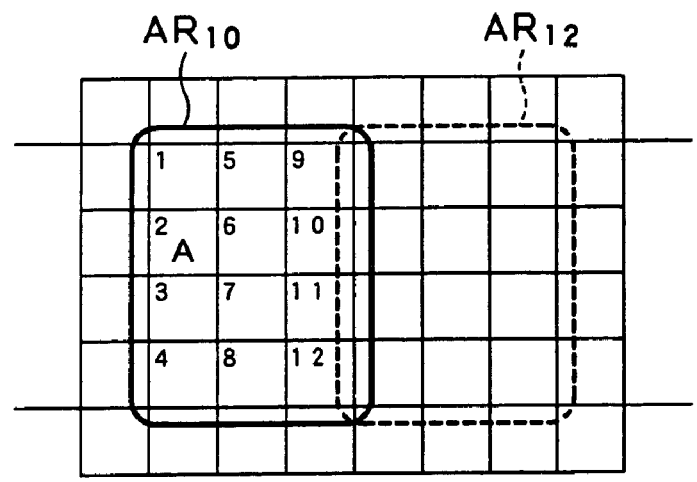
FIG.20B

FIG.21A
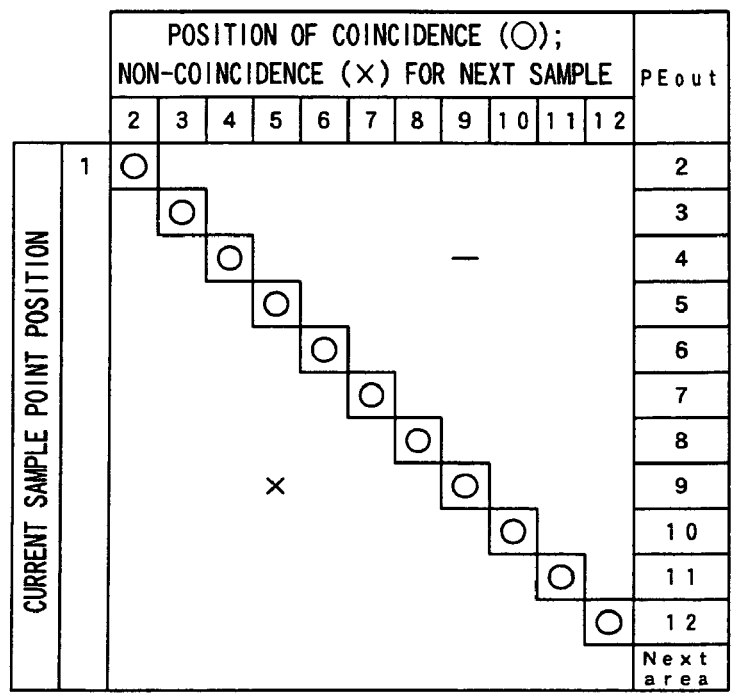
FIG.21B
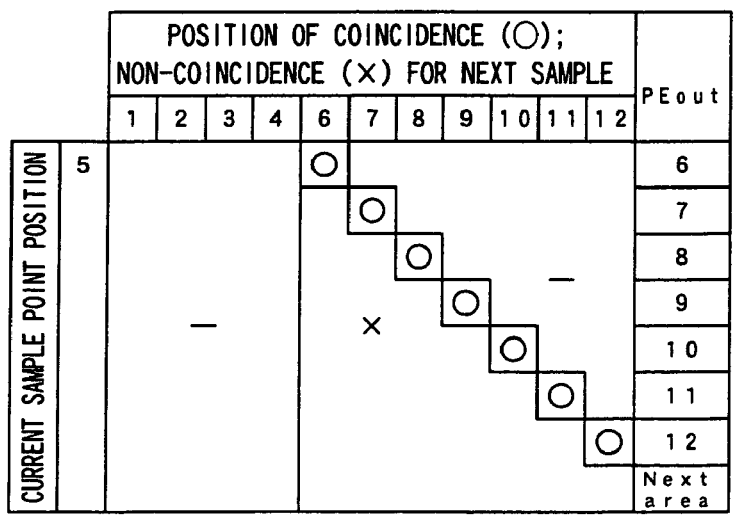
FIG. 21

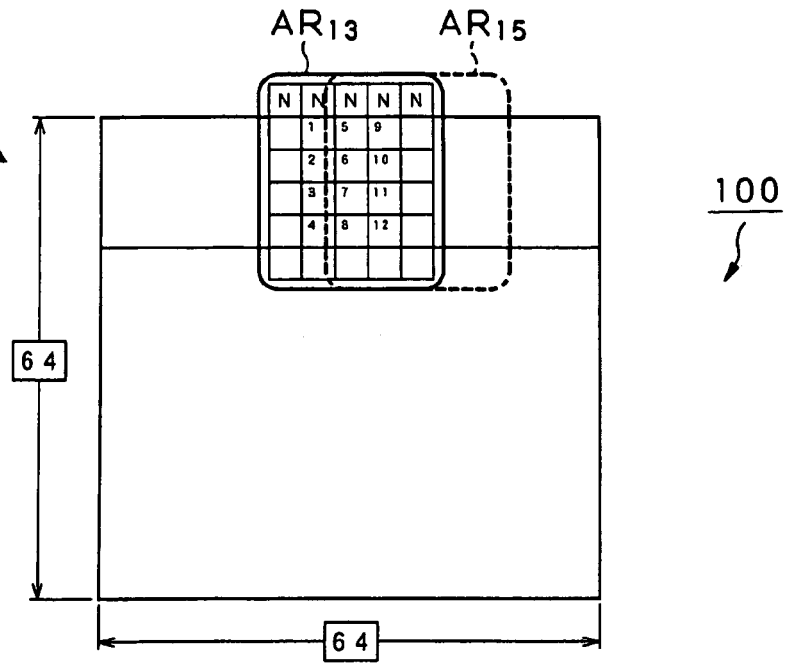
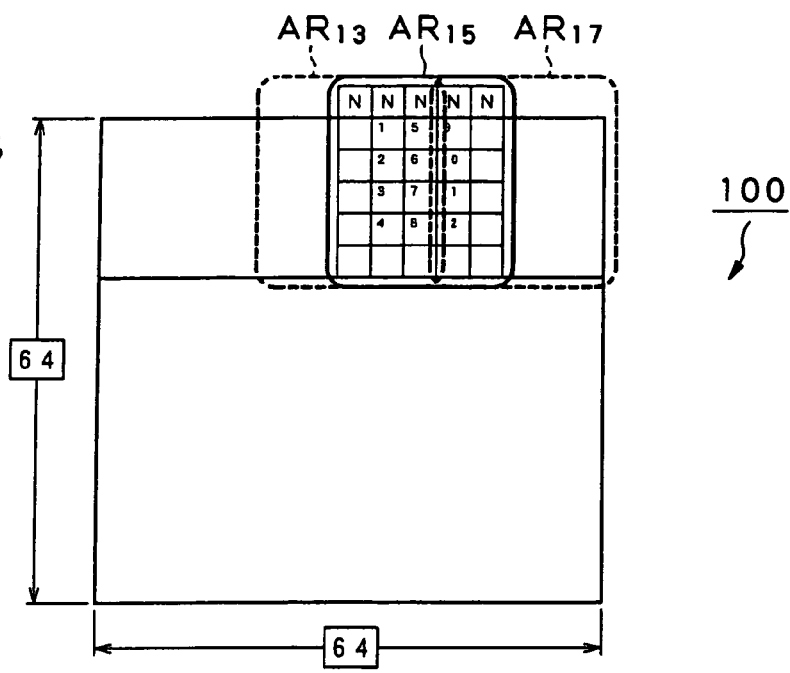
FIG. 23

FIG.24A
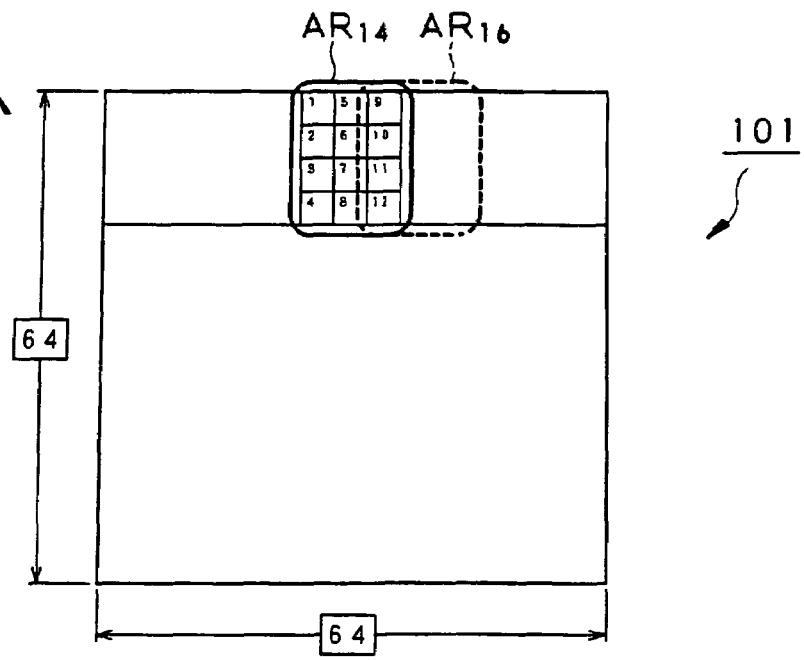
FIG.24B
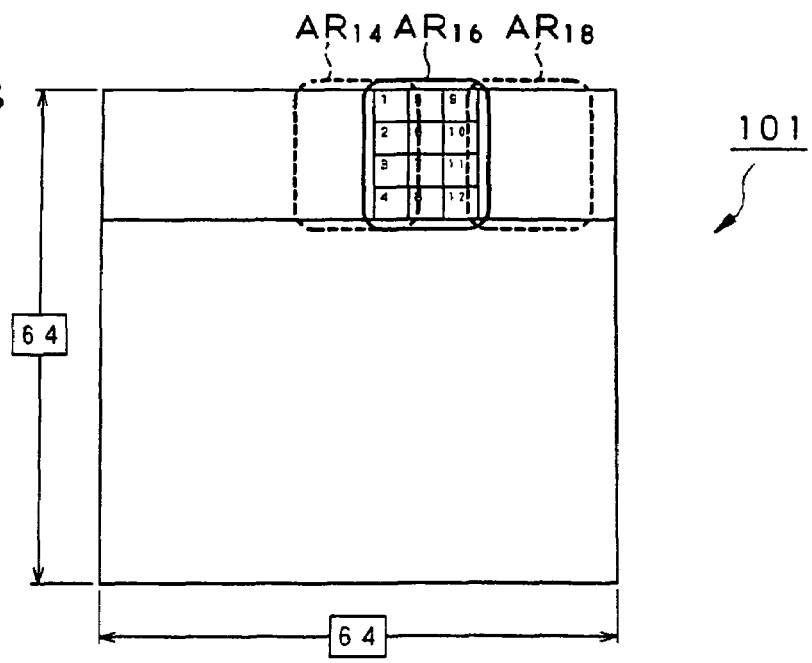
FIG. 24

SEARCH (FOR 1)
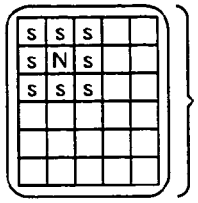
AND/OR CIRCUIT $103_1$
$= !\, 1 \cdot (A + B + 2 + 5 + 6 + I + J + K)$
SEARCH (FOR 4)
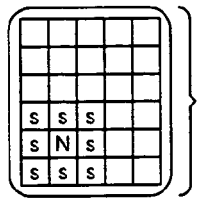
AND/OR CIRCUIT $103_4$
$= !\, 4 \cdot (C + D + 3 + 7 + 8 + O + P + Q)$
SEARCH (FOR 7)
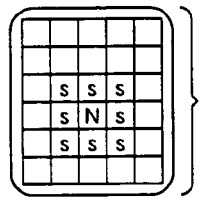
AND/OR CIRCUIT $103_7$
$= !\, 7 \cdot (2 + 3 + 4 + 6 + 8 + 10 + 11 + 12)$
SEARCH (FOR 12)
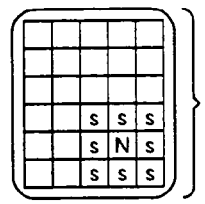
AND/OR CIRCUIT $103_{12}$
$= !\, 12 \cdot (7 + 8 + 11 + G + H + Q + R + S)$
FIG.26

IMAGE CODING APPARATUS AND METHOD, AND PROGRAM AND RECORDING MEDIUM

BACKGROUND OF THE INVENTION

1. Field of the Invention

The present invention relates to an image coding apparatus and method for compressing an image by wavelet transform and entropy coding as in JPEG-2000 for example, a program for allowing a computer to perform image coding, and a recording medium having the program recorded therein.

This application claims the priority of the Japanese Patent Application No. 2002-236620 filed on Aug. 14, 2002, the entirety of which is incorporated by reference herein.

2. Description of the Related Art

One of the typical image compression standards is JPEG (Joint Photographic Experts Group) standardized by the ISO (International Standards Organization). This is well known for assuring quality coding and decoding of an image and coded image, respectively, when comparatively many bits are assigned to the image using the discrete cosine transform (DCT). However, when the number of coding bits is reduced to more than a certain extent, the block skew peculiar to DCT will become noticeable and image degradation will also be noticeable subjectively.

Recently, there have actively been studied the techniques of dividing an image by a filter, called "filter bank", formed from a combination of a high-pass filter and low-pass filter into a plurality of frequency bands and coding the image with respect to each divided band. Of these techniques, the wavelet transform coding is regarded as a new most promising technique which can take the place of DCT because it is free from the noticeable block skew caused by DCT when an image is highly compressed.

For example, JPEG-2000 internationally standardized completely in January, 2001 adopts a combination of the wavelet transform and high-efficiency entropy coding (bit modeling in units of a bit plane and arithmetic coding) and has been considerably improved in efficiency of coding as compared with the conventional JPEG.

In an image encoder to compress an image by coding as in JPEG-2000, an input image is divided into a plurality of subbands by making wavelet transform of the image, and a wavelet transform coefficient is quantized for each of the subbands. Then, a quantization coefficient thus determined for each subband is divided into coding blocks, namely, units of entropy coding, each having a predetermined size of about 64×64, for example, and the quantization coefficient in units of a coding block is modeled by coefficient bit.

The coefficient bit modeling will be explained in detail below. It should be noted that the coefficient bit modeling will be described taking the entropy coding called "embedded coding with optimized truncation (EBCOT)" defined in JPEG-2000 as an example. The "EBCOT" is referred in detail to the publication "ISO/IEC 15444-1, Information Technology—JPEG 2000, Part 1: Core coding system" etc.

Prior to the explanation of EBCOT, the concept of a bit plane will first be explained with reference to FIG. 1. FIG. 1(A) shows a quantization coefficient assumed to include sixteen coefficients (four by four). As shown, one of the sixteen coefficients has a largest absolute value of 13 whose binary notation is "1101". Therefore, the bit plane defined by absolute values of the coefficients is a layer of four bit planes as shown in FIG. 1(B). It should be noted that all elements (sample points) in each bit plane take a value "0" or "1". On the other hand, all the quantization coefficients take a value "0" or a positive value except for one which takes a value "−6". Therefore, a code bit plane is as shown in FIG. 1(C).

EBCOT is a means for coding each block having a predetermined size while measuring the statistic amount of coefficient bit data in the block. By this means, the coefficient bit data is entropy-coded in code blocks. The code block is coded independently for each bit plane in a direction from the most significant bit (MSB) toward least significant bit (LSB). Also, the code block has a size which is a two's power from 4 to 256, normally, any of 32×32, 64×64, 128×32, etc. The quantization coefficient is represented by a signed binary number of n bits of which bit 0 to bit (n−2) indicate LSB to MSB, respectively. It should be noted that a remaining one bit indicates a sign. The code block is processed by three kinds of coding passes (a) to (c) as follows starting with an MSB-side bit plane.

(a) Significance Propagation pass
(b) Magnitude Refinement pass
(c) Cleanup pass The three coding passes are used in an order shown in FIG. 2. As shown in FIG. 2, a bit plane (n−2) (MSB) is first processed by the "Cleanup pass" (will be referred to as "CU pass" wherever appropriate hereunder). Next, each bit plane is processed by the "Significance Propagation pass" (will be referred to as "SP pass" wherever appropriate hereunder) and "Magnitude Refinement pass" (will be referred to as "MR pass" wherever appropriate hereunder) and CU pass sequentially in this order toward LSB.

Actually, however, it is described in the header in which bit plane counted from MSB "1" appears first, not to code any bit plane of all "0". By coding a bit plane with repetition of the three kinds of coding passes in the above order and exiting the coding when up to an arbitrary coding pass of an arbitrary bit plane is completed, it is possible to make a tradeoff between the code amount and image quality, that is, it is possible to control the rate.

The coefficient bit data is scanned as will be described herebelow with reference to FIG. 3. The code block is divided into a stripe at every four sample points in height. The stripe width is equal to the width of the code block. The order of scanning is an order in which all sample points in one code block are scanned. In the code block, sample points are scanned from an upper stripe to a lower one. In each stripe, sample points are scanned from a left column to a right one. In each column, sample points are scanned from top to bottom. It should be noted that in each coding pass, all the sample points in the code block are processed in the order of scanning. The above-mentioned three coding passes will be described below.

(a) Significance Propagation (SP) Pass

In the SP pass to code a bit plane, coefficient bit data at "non-significant" sample points near "8" and of which at least one is "significant" are coded arithmetically. When the coded coefficient bit data is "1", the signs, plus and minus, of the code are successively coded arithmetically.

The term "significant" used herein refers to a state the coder has for each of sample points. The initial value of "significant" is "0" which means "non-significant", and when "1" is coded for the sample point, the initial value changes to "1" which means "significant" and it will always stay at "1". Therefore, the "significant" can be said to be a flag indicating whether effective-digit information has already been coded. When an SP pass takes place in a bit plane, no SP pass will take place in any subsequent bit planes.

(b) Magnitude Refinement (MR) Pass

In the MR pass to code a bit plane, coefficient bit data at a "significant" sample point, not processed by the SP pass which codes the bit plane, is coded arithmetically.

(c) Cleanup (CU) Pass

In the CU pass to code a bit plane, coefficient bit data at a "non-significant" sample point, not processed by the SP plane which codes the bit plane, is coded arithmetically. When the coded coefficient bit data is "1", the signs, plus and minus, of the code are successively coded arithmetically.

Note that in the arithmetic coding in the above three coding passes, the context at a sample point is selected by selectively using Zero Coding (ZC), Run-length Coding (RLC), Sign Coding (SC) or Magnitude Refinement (MR) as the case may be. Then, a context selected by arithmetic coding called "MQ coding" is coded. The MQ coding is a binary arithmetic coding of a learning type defined in JBIG2. The MQ coding is referred to the publication "ISO/IEC FDIS 14492, "Lossy/Lossless Coding of Bi-level Images", March 2000" and the like, for example. In JPEG-2000, there is defined a total of 19 kinds of contexts for all coding passes.

In the image coder to compress by coding according to JPEG-2000 as above, a quantization coefficient of each code block is decomposed into bit planes, each of the bit planes is decomposed into three coding passes, and coefficient bit data is generated for each of the coding passes. Then, the coefficient bit data for each coding pass is coded arithmetically.

The MR pass is intended for arithmetic coding of coefficient bit data which is made "significant" by the CU pass or SP pass in any other bit plane, and the CU pass is intended for arithmetic coding of "non-significant" coefficient bit data not processed by the SP pass. Therefore, it is believed that if the SP pass can be done at a higher speed, code blocks can be processed by the three cording passes at a higher speed.

In the SP pass, coefficient bit data at "non-significant" sample points near "8" and of which at least one is "significant" are coded arithmetically as above. When the coded coefficient bit data is "1", the state of the sample point changes from "non-significant" to "significant". Conventionally, since a sample point to be processed by the SP pass will take place due to the state change as the case may be, it is not possible to selectively code only sample points which have to be processed by the SP pass.

This problem will be described simply below with reference to FIG. 4. It should be noted that in FIG. 4, there is shown an assumed bit plane consisting of a total of sixteen (four by four) coefficient bit data, and an expediential number is appended at upper left in each sample point to indicate the position of the sample point. In FIG. 4, the thick-line frame indicates a "significant" sample point. As shown in FIG. 4(A), since only the tenth sample point is "significant" at a step of starting a bit plate coding, eight samples, that is, fifth to seventh, ninth, eleventh, thirteenth to fifteenth, are to be processed by the SP pass. Since coefficient bit data at the seventh sample point is "1", however, this sample point will be changed by the SP pass to the state "significant" as shown in FIG. 4(B). Thus, the eighth and twelfth samples will be new sample to be processed by the SP pass.

On this account, a sample point is judged to be or not to be a one to be processed by the SP pass in the order of scanning. When the sample point is determined to be processed by the SP pass, it is processed by the SP pass. If the sample point is not any one to be processed so, a next sample point is judged. Such operations are repeatedly done. Thus, a number of operation cycles for sample points included in a bit plate and which are to be processed by the SP pass within a bit plane cannot complete the SP pass but a number of operation cycles for all the sample points is required.

OBJECT AND SUMMARY OF THE INVENTION

It is therefore an object of the present invention to overcome the above-mentioned drawbacks of the related art by providing an image coding apparatus and method, capable of coding a code block by three coding passes at a higher speed with a reduced time taken by the SP pass, a program allowing a computer to execute the image coding, and a computer-readable recording medium having the program recorded therein.

The above object can be attained by providing an image coder including according to the present invention:

a wavelet transform means for dividing an input image into subbands by wavelet transform;

a code block generating means for dividing each of the subbands generated by the wavelet transform means into code blocks each of a predetermined size;

a bit plane generating means for generating a bit plane including from a most significant bit to least significant bit in units of the code block;

a coding pass processing means for processing each of sample points in the bit plane by any of a plurality of coding passes; and an arithmetic coding means for making arithmetic coding according to results of the coding pass processing;

the coding pass processing means reading, from a storage means, significance ant/non-significance information indicating whether sample points in an area including the position of a sample point being currently processed and which is occupied by a predetermined number of samples, and those existing around the area, are significant or non-significant, and making a parallel comparison between the significance/non-significance information and a plurality of preset matching patterns, thereby detecting a next sample point to be processed.

Also, the above object can be attained by providing an image coder including according to the present invention:

a wavelet transform means for dividing an input image into subbands by wavelet transform;

a code block generating means for dividing each of the subbands generated by the wavelet transform means into code blocks each of a predetermined size;

a bit plane generating means for generating a bit plane including from a most significant bit to least significant bit in units of the code block;

a coding pass processing means for processing each of sample points in the bit plane by any of a plurality of coding passes; and an arithmetic coding means for making arithmetic coding according to results of the coding pass processing;

the coding pass processing means reading, from a storage means, significance ant/non-significance information indicating whether sample points in the bit plane and those around them are significant or non-significant, and making a parallel comparison between the significance/non-significance information and a plurality of preset matching patterns, thereby detecting, as a next sample point to be processed, a one, nearest to the position of a sample point being currently processed, of the sample points having been determined, as the result of the comparison, to fit any of the plurality of matching patterns.

In the above image coders according to the present invention, for processing each of sample points in a bit plate by the significance propagation (SP) pass defined in JPEG-2000 for example, there is read, from a storage means, significance ant/non-significance information indicating whether sample points in an area including the position of a sample point being currently processed and which is occupied by a predetermined number of samples and those existing around the area, are significant or non-significant and a parallel comparison is made between the significance/non-significance information and a plurality of preset matching patterns, or there is read, from a storage means, significance ant/non-significance information indicating whether sample points in the bit plane and those around them are significant or non-significant, and a parallel comparison is made between the significance/non-significance information and a plurality of preset matching patterns. In case there is found, as a result of the comparison, a sample point to be processed by the SP pass in an area under search, jump is made to that sample point for SP pass processing and sample points not be to be processed by the SP pass are not so processed.

Also, the above object can be attained by providing an image coding method including, according to the present invention, the steps of:

dividing an input image into subbands by wavelet transform;

dividing each of the subbands generated in the wavelet transform step into code blocks each of a predetermined size;

generating a bit plane including from a most significant bit to least significant bit in units of the code block;

processing each of sample points in the bit plane by any of a plurality of coding passes; and making arithmetic coding according to results of the coding pass processing;

in the coding pass processing, there being read, from a storage means, significance ant/non-significance information indicating whether sample points in an area including the position of a sample point being currently processed and which is occupied by a predetermined number of samples, and those existing around the area, are significant or non-significant, and a parallel comparison being made between the significance/non-significance information and a plurality of preset matching patterns, thereby detecting a next sample point to be processed.

Also, the above object can be attained by providing an image coding method including, according to the present invention, the steps of:

dividing an input image into subbands by wavelet transform;

dividing each of the subbands generated in the wavelet transform step into code blocks each of a predetermined size;

generating a bit plane including from a most significant bit to least significant bit in units of the code block;

processing each of sample points in the bit plane by any of a plurality of coding passes; and making arithmetic coding according to results of the coding pass processing;

in the coding pass processing means, there being read, from a storage means, significance ant/non-significance information indicating whether sample points in the bit plane and those around them are significant or non-significant, and a parallel comparison being made between the significance/non-significance information and a plurality of preset matching patterns, thereby detecting, as a next sample point to be processed, a one, nearest to the position of a sample point being currently processed, of the sample points having been determined, as the result of the comparison, to fit any of the plurality of matching patterns.

In the above image coding method according to the present invention, for processing each of sample points in a bit plate by the significance propagation (SP) pass defined in JPEG-2000 for example, there is read, from a storage means, significance ant/non-significance information indicating whether sample points in an area including the position of a sample point being currently processed and which is occupied by a predetermined number of samples and those existing around the area, are "significant" or "non-significant" and a parallel comparison is made between the significance/non-significance information and a plurality of preset matching patterns, or there is read, from a storage means, significance ant/non-significance information indicating whether sample points in the bit plane and those around them are "significant" or "non-significant", and a parallel comparison is made between the significance/non-significance information and a plurality of preset matching patterns. In case there is found, as a result of the comparison, a sample point to be processed by the SP pass in an area under search, jump is made to that sample point for SP pass processing and sample points not be to be processed by the SP pass are not so processed.

Also, the above object can be attained by providing a program allowing a computer to execute the above-mentioned image coding, and also by providing a computer-readable recording medium having the program recorded therein.

These objects and other objects, features and advantages of the present invention will become more apparent from the following detailed description of the preferred embodiments of the present invention when taken in conjunction with the accompanying drawings.

BRIEF DESCRIPTION OF THE DRAWINGS

FIG. 4 explains a conventional SP pass, FIG. 4(A) showing "significant" sample points before the SP pass and FIG. 4(B) showing the "significant" sample points newly developed in the SP pass;

FIG. 5 schematically explains the construction of the image coder according to the present invention;

FIG. 11 explains an address jump in the bit-plane coding pass generator in FIG. 9, FIG. 11(A) showing an example in which a sample point to be processed by the SP pass is found in an area $AR_1$, and FIG. 11(B) showing an example in which no sample point to be processed by the SP pass is found in an area $AR_1$;

FIG. 12 shows a table for outputting of jump address values;

FIG. 14 explains an S/N bit memory in the bit-plane code pass generator in FIG. 9, FIG. 14(A) showing an area setting when a shift is made from the second sample to eleventh one, and FIG. 14(B) showing an area setting when a jump is made from one to another area;

FIG. 15 explains a coefficient bit memory in the bit-plane coding pass generator in FIG. 9, FIG. 15(A) showing an area setting when a shift is made from the second sample to eleventh one, and FIG. 15(B) showing an area setting when a jump is made from one to another area;

FIG. 17 explains a pattern matching made for the eleventh sample in an AND/OR circuit;

FIG. 19 shows an S/N matching pattern in a second method;

FIG. 20 explains a jump from one to another address in the bit-plane coding pass generator in FIG. 9, FIG. 20(A), FIG. 11(A) showing an example in which a sample point to be processed by the SP pass is found in an area $AR_{10}$, and FIG. 20(B) showing an example in which no sample point to be processed by the SP pass is found in an area $AR_{10}$;

FIG. 21 shows a relation between positions of coincidence and non-coincidence with an S/N matching pattern and a priority encoder output, FIG. 21(A) showing such a relation when the first sample point is being currently processed and FIG. 21(B) showing such a relation when the fifth sample point is being currently processed;

FIG. 23 explains the S/N bit memory in the bit-plane coding pass generator in FIG. 9, FIG. 23(A) showing an area setting when a shift is made from the second sample to eleventh sample, and FIG. 23(B) showing an area setting when a jump is made from one to another area;

FIG. 24 explains the coefficient bit memory in the bit-plane coding pass generator in FIG. 9, FIG. 25 showing an area setting when a shift is made from the second sample to eleventh sample, and showing an area setting when a jump is made from one to another area;

FIG. 26 explains a pattern matching in an AND/OR circuit for the first, fourth, seventh and eleventh samples.

DETAILED DESCRIPTION OF THE PREFERRED EMBODIMENTS

Figure 1:
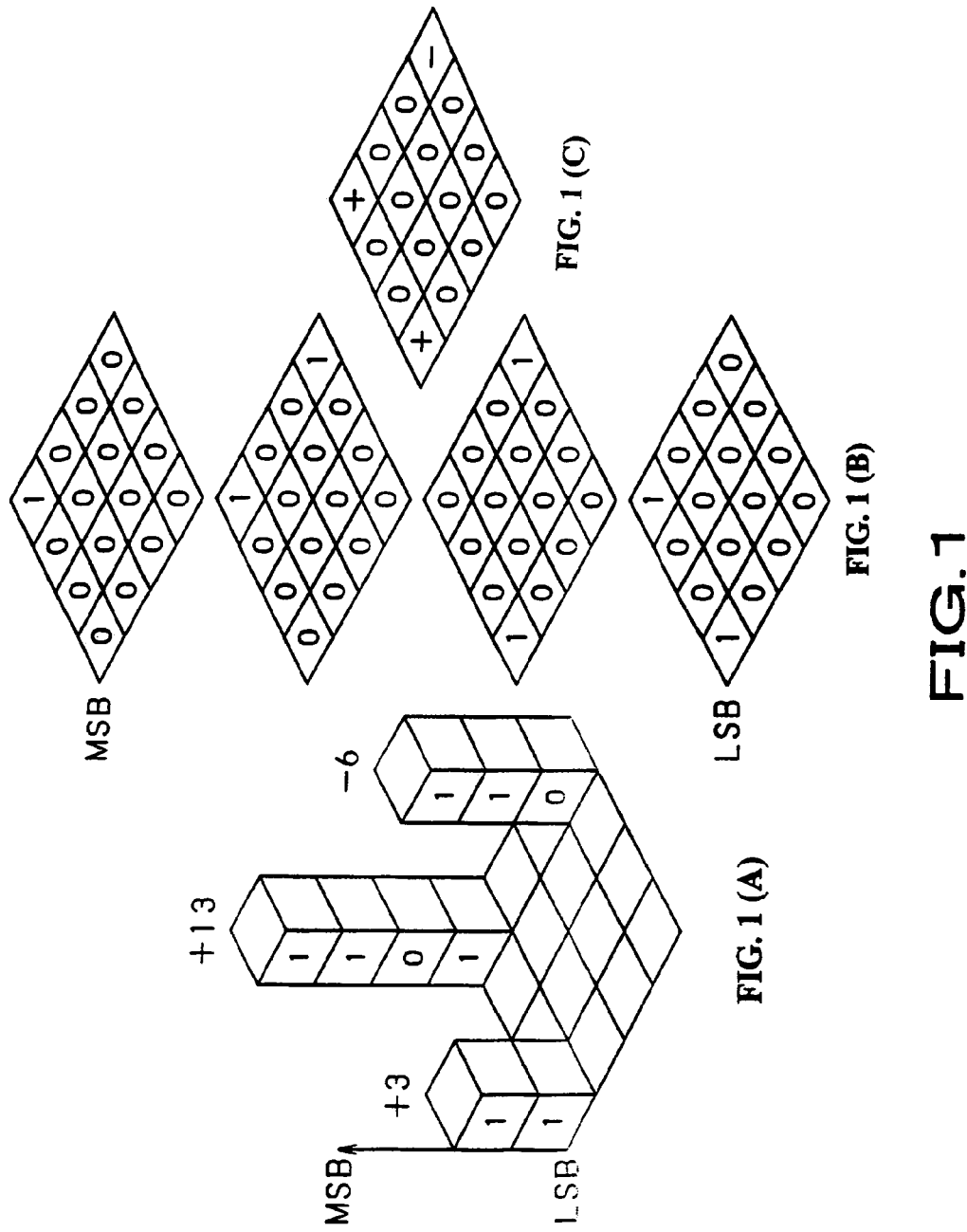
FIG. 1 explains a bit plane, FIG. 1(A) showing a quantization coefficient consisting of sixteen coefficients in total, FIG. 1(B) showing bit planes of absolute values of the coefficients and FIG. 1(C) showing a bit plane of codes.
Figure 2:
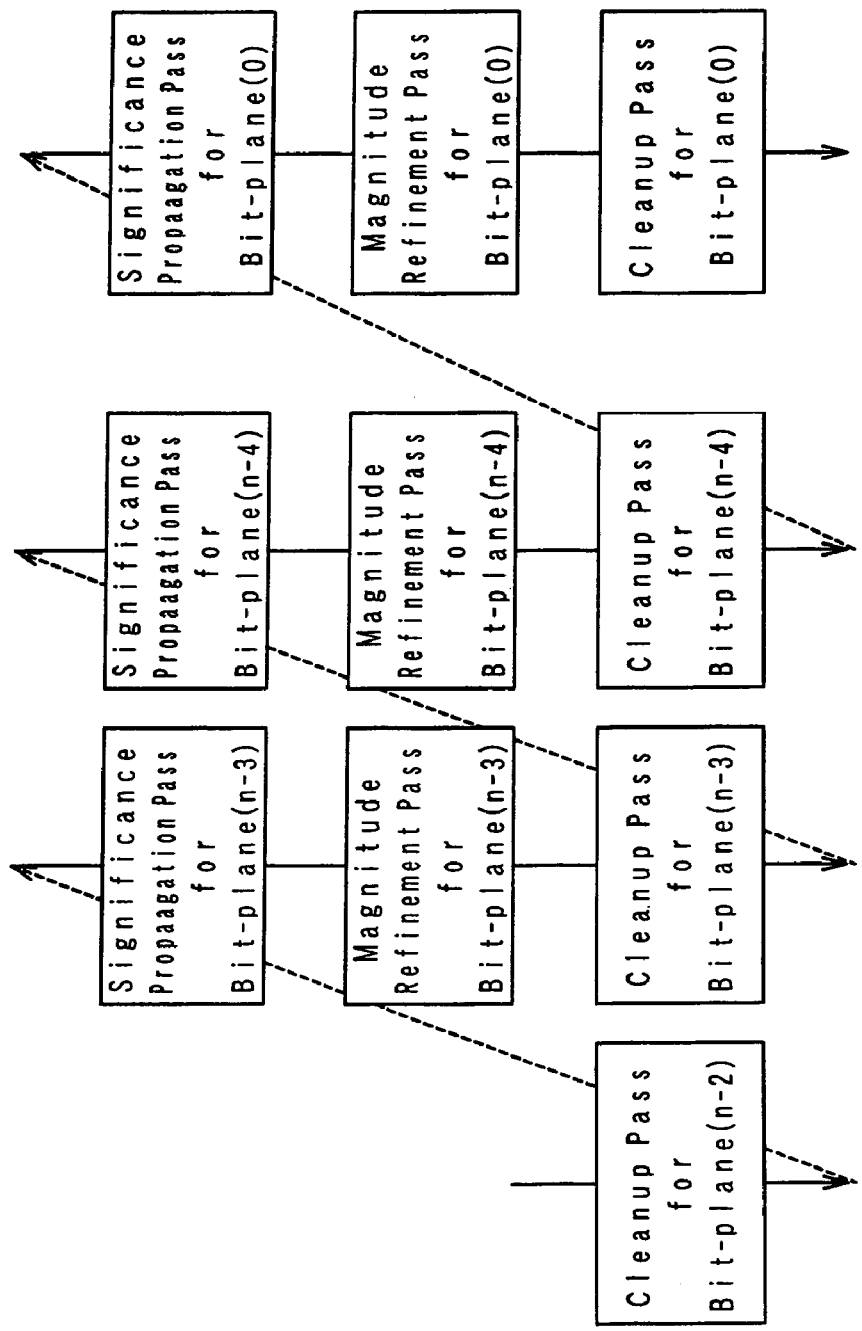
FIG. 2 explains a procedure for a coding pass in a coding block.
Figure 3:
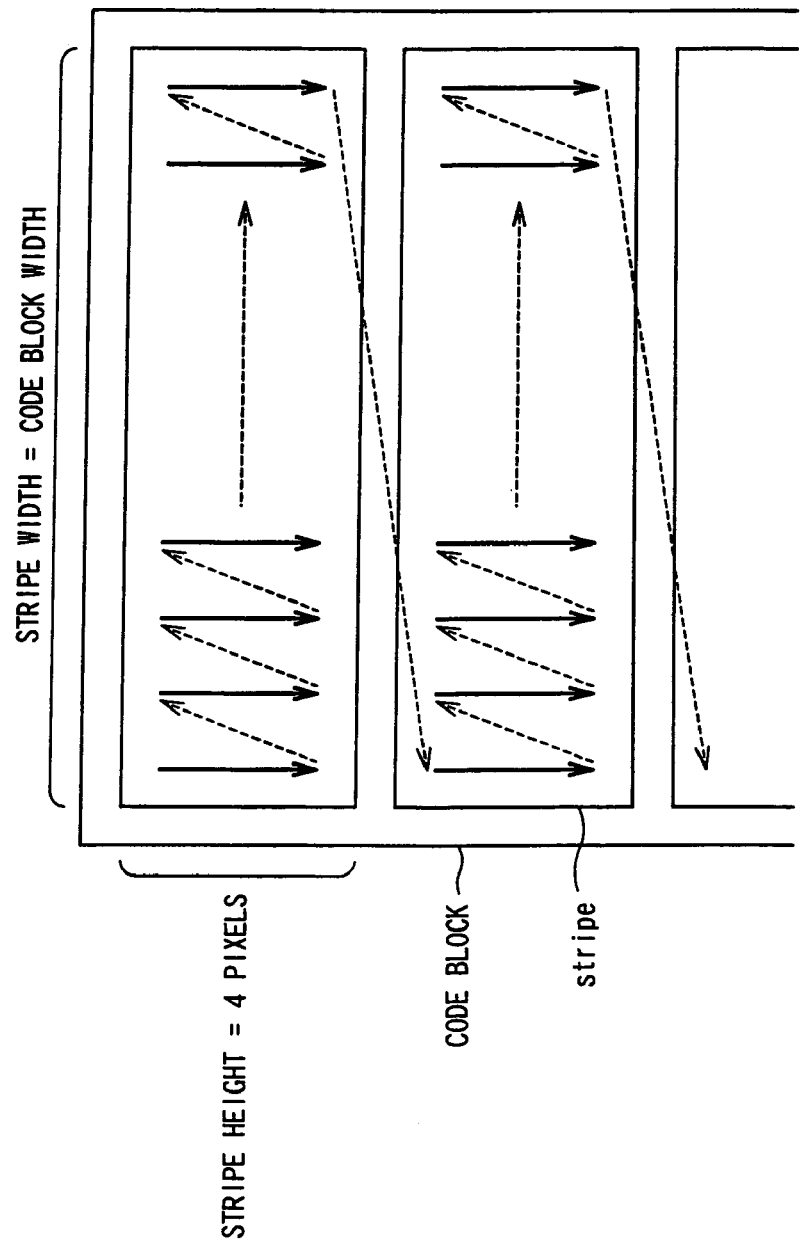
FIG. 3 explains an order of scanning the coefficients in the coding block.

Embodiments of the present invention will be described in detail hereinbelow with reference to the accompanying drawings. The embodiments are applications of the present invention to an image coding apparatus and method, capable of compressing an input image by coding according to JPEG-2000. The image coder codes a code block at a higher speed by reducing the time for the significance propagation pass for coding a bit plane.

Referring now to FIG. 5, there is schematically illustrated the construction of the image coder according to the present invention. The image coder is generally indicated with a reference 1. As shown in FIG. 5, the image coder 1 includes a DC level shifter 10, wavelet transform circuit 11, quantizer 12, code blocking circuit 13, bit-plane coding pass generator 14, arithmetic coding circuit 15, rate controller 17, header generator 18 and a packet generator 19. The bit-plane coding pass generator 14 and arithmetic coding circuit 15 form together an EBCOT (embedded coding with optimized truncation) circuit 16.

The DC level shifter 10 shifts the level of an original signal to make an efficient wavelet transform in the downstream wavelet transform circuit 11 for an improved compression ratio. Theoretically, the compression ratio can be improved by shifting the level of an original signal to a half of the dynamic range of the signal because an RGB signal has a positive value (an unsigned integer). On the other hand, since each of color-difference signals Cb and Cr in a YCbCr signal has both positive and negative integral values, they are not shifted in level.

The wavelet transform circuit 11 is normally formed from a filter bank including a low-pass filter and high-pass filter. It should be noted that since a digital filter normally has an impulse response (filter factor) of multiple tap lengths, it is necessary to pre-buffer a sufficient number of input images for filtering, which however is not shown in FIG. 5 since it is simple without the necessary of any detailed explanation.

The DC level shifter 10 is supplied with a minium necessary image signal D10 for the filtering and shifts the level of the input signal as above. Then, the wavelet transform circuit 11 filters, for the wavelet transform, an image signal D11 resulted from the DC level shift to generate a wavelet transform coefficient D12.

Figure 6:
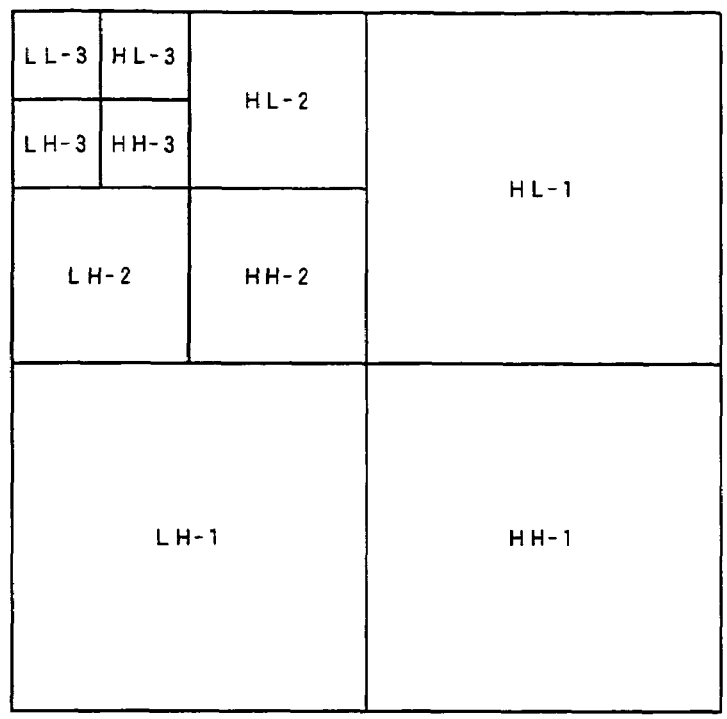
FIG. 6 explains subbands resulted from wavelet transform and division of an image to the third level.

Normally, low-frequency components are repeatedly subjected to the wavelet transform as shown in FIG. 6 because the majority of image energy is concentrated to the low-frequency components. As shown in FIG. 6, the number of levels of the wavelet transform is three, resulting in a total of ten subbands. It should be noted that in FIG. 6, "L" and "H" indicate a low-frequency band and high-frequency band, respectively, and a number suffixed to each of "L" and "H" indicates the level of a division. That is, for example, "LH-1" indicates a subband lower in frequency in the horizontal direction and higher in frequency in the vertical direction and whose division level is one.

The quantizer 12 makes an irreversible compression of the wavelet transform coefficient D12 supplied from the wavelet transform circuit 11. It can use, as a quantizing means, a scalar quantization in which the wavelet transform coefficient D12 is divided by the size of a quantizing step. JPEG-2000 defines that when the above irreversible compression is made using an irreversible 9×7 wavelet transform filter, the scalar quantization should be adopted automatically. On the other hand, in case a reversible 5×3 wavelet transform filter is used, code amount is controlled by truncating the coding pass as will be described later without making any quantization. Therefore, the quantizer 12 shown in FIG. 5 is actually put in operation only when the irreversible 9×7 wavelet transform filter is used. In the following explanation, it is assumed that the irreversible 9×7 wavelet transform filter is used.

Figure 7:
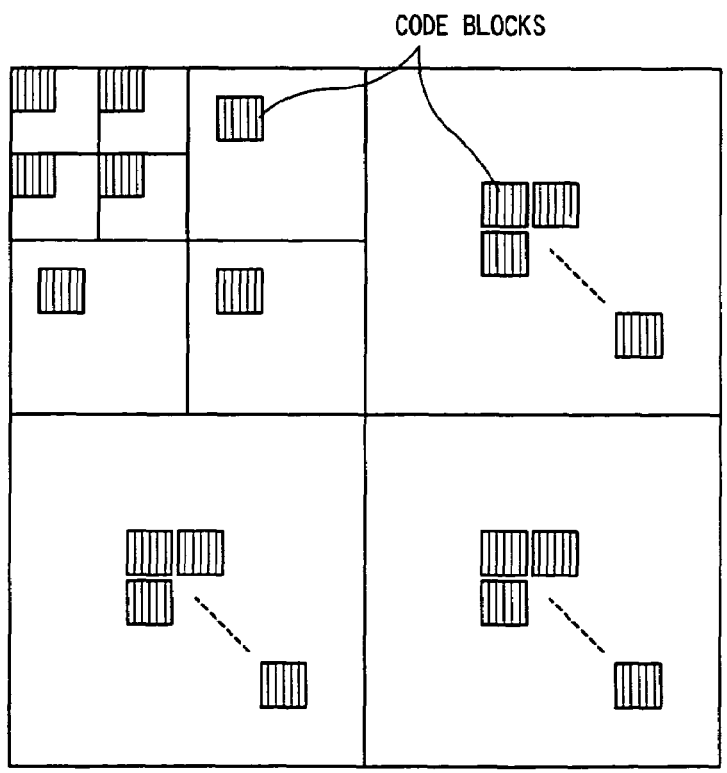
FIG. 7 explains the relation between a coding block and subbands.

The code blocking circuit 13 is provided to divide a quantization coefficient D13 generated by the quantizer 12 into code blocks each being a unit of entropy coding and having a predetermined size. The positional relation between code blocks in a subband is shown in FIG. 7. Normally, code blocks each having a size of about 64×64 are generated in each of all the subbands resulted from the division of an image. Therefore, in case a subband HH-1(in FIG. 6), whose division level is the lowest, has a size of 640×320, it will include ten blocks in the vertical direction and five blocks in the horizontal direction, namely a total of 50 blocks of 64×64 in size. The code blocking circuit 13 supplies a quantization coefficient D14 for each code block to the bit-plane coding pass generator 14, and coding in the downstream system will be done in units of the code block.

The bit-plane coding pass generator 14 makes a coefficient bit modeling of the quantization coefficient D14 for each code block. It should be noted that the embodiment of the present invention will be explained especially concerning the entropy coding called "EBCOT" defined in JPEG-2000 as an example.

EBCOT is a means for coding each block of a predetermined size while measuring the statistical amount of coefficients in the block. It makes an entropy coding of the quantization coefficient in units of the code block. It should be noted that each code block has a size which is a two's power from 4 to 256, normally, any of 32×32, 64×64, 128×32, etc.

The quantization coefficient D14 for each code block is represented by a signed binary number of n bits of which bit 0 to bit (n−2) represent bits from LSB to MSB, respectively. It should be noted that the remaining one bit is a sign. A quantization coefficient represented by a binary number consists of a bit plane of an absolute value of the coefficient and a bit plane of a sign of the coefficient. The aforementioned code blocks are coded independently for each bit plane by three kinds of coding passes called "significance propagation (SP) pass", "magnitude refinement (MR) pass" and "cleanup (CU) pass" in a direction from MSB toward LSB.

First, a bit plane of the most significant bit (MSB) is coded by CU pass. Next, bit planes of subsequent bits are coded by SP pass, MR pass and CU pass in this order in the direction of LSB.

Briefly speaking, in the SP pass, coefficient bit data at non-significant sample points near "8" and of which at least one is "significant" undergoes arithmetic coding. When the coded coefficient bit data is "1", the signs, plus and minus, of the code are successively coded arithmetically. The term "significant" used herein refers to a state the coder has for each of sample points. The initial value of "significant" is "0" which means "non-significant", and when "1" is coded for the sample point, the initial value changes to "1" which means "significant" and it will always stay at "1". Therefore, the "significant" can be said to be a flag indicating whether effective-digit information has already been coded. In the MR pass, coefficient bit data at a "significant" sample point, not processed by the SP pass, is coded arithmetically. Also, in the CU pass, coefficient bit data at a "non-significant" sample point, not processed by the SP pass, is coded arithmetically. When the coded coefficient bit data is "1", the signs, plus and minus, of the code are successively coded arithmetically.

Actually, however, it is described in the header in which bit plane counted from MSB "1" appears first, not to code any bit plane of all "0". By coding a bit plane with repetition of the three kinds of coding passes in the above order and exiting the coding when up to an arbitrary coding pass of an arbitrary bit plane is completed, it is possible to make a tradeoff between the code amount and image quality, that is, it is possible to control the rate.

Note that in the arithmetic coding in the above three coding passes, the context at a sample point is selected by selectively using Zero Coding (ZC), Run-length Coding (RLC), Sign Coding (SC) or Magnitude Refinement (MR) as the case may be. Then, a context selected by arithmetic coding called "MQ coding" is coded. The MQ coding is a binary arithmetic coding of a learning type defined in JBIG2. In JPEG-2000, there is defined a total of 19 kinds of contexts for all coding passes.

As above, the bit-plane coding pass generating 14 decomposes the quantization coefficient D14 for each code block into bit planes, and decomposes each bit plane into three coding passes, to thereby generate a quantization coefficient D15 for each coding pass. Then the arithmetic coding circuit 15 will make an arithmetic coding of the quantization coefficient D15 for each coding pass.

The rate controller 17 counts the code amount of an arithmetic code D16 supplied from the arithmetic coding circuit 15 after arithmetic coding of at least some coding passes, and when having counted a target code amount or just before having counted the target code amount, the rate controller 17 will truncate any subsequent arithmetic codes D16 supplied from the arithmetic coding circuit 15. By truncating the arithmetic codes before the count is over the target code amount, the rate controller 17 can positively limit the code amount to the target one. After completion of the code amount control, the rate controller 17 supplies an arithmetic code D17 to the header generator 18 and packet generator 19.

The header generator 18 generates, as a header D18, additional information in a code block, for example, a number of coding passes in the code block, data length of compressed code stream, etc. on the basis of the arithmetic code D17 supplied from the rate controller 17 after completion of the code amount control, and supplies the header D18 to the packet generator 19.

Figure 8:
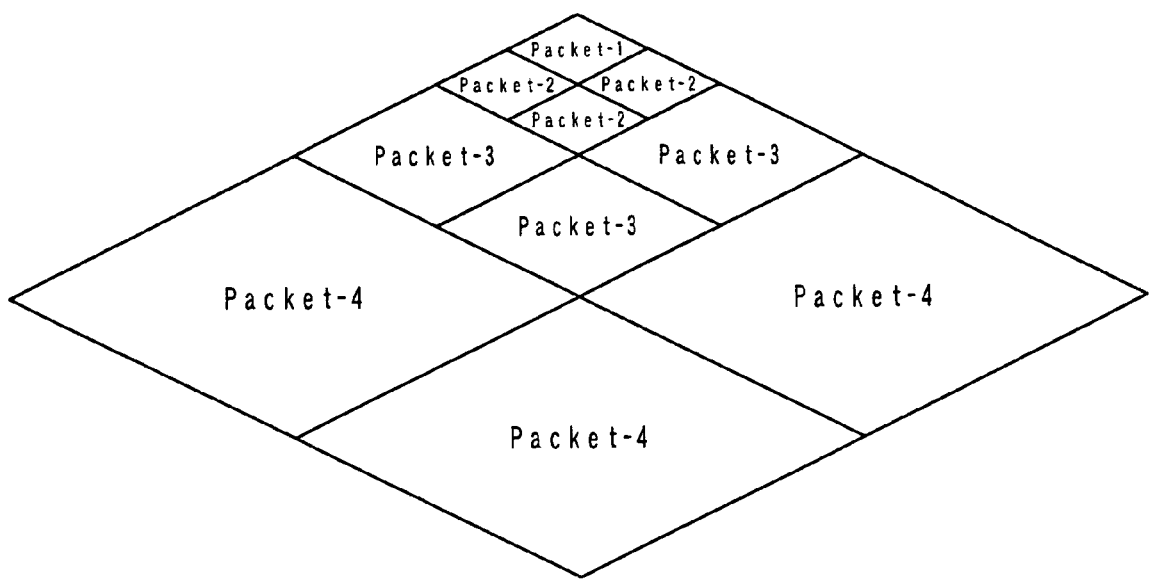
FIG. 8 explains packets generated in the image coder shown in FIG. 5.

The packet generator 19 combines the arithmetic code D17 indicative of the completion of the code amount control and header D18 to generate a packet D19, and outputs it as a coding code stream. At this time, the packet generator 19 generates separate packets at the same resolution level as shown in FIG. 8. It should be noted that as seen from FIG. 8, a Packet-1 whose frequency is in the lowest band includes only LL component and other Packet-2 to Packet-4 include LH, HL and HH components.

As above, the image coder 1 according to the present invention can make coding-compression of an input image with a high efficiency by the wavelet transform and entropy coding, packetize the coded data and output the packets as a compressed code stream.

Note that conventionally, for operation with the aforementioned three kinds of coding passes, coefficient bit data is processed in such an order that after four sample points are processed from top to bottom in each bit plane, a right upper adjacent sample point is processed. If there is no right-adjacent sample point, a left lower sample point is processed.

Especially for the SP pass, when a coded coefficient bit data is "1", the state of the sample point may possibly change from "non-significant" to "significant" and a new sample point to be processed by SP pass take place due to the change. So, it is not possible to selectively process only a sample point to be processed by SP pass.

On this account, the related art incurs a problem that the SP pass processing cannot be completed with a number of processing cycles equivalent to the number of sample points to be processed by SP pass and a number of processing cycles equivalent to all samples is required.

To overcome the above problems of the related art, the image coder 1 according to the present invention effects the SP pass processing at a higher speed by two kinds of methods which will be described below:

First, the concept of the first method will be described. In this technique, an S/N bit memory is prepared which indicates the "significant (S)" or "non-significant (N)" state of each sample point in a code block. In case the code block has a size of 64×64, the S/N bit memory has a size of 64×64×1 bits. When the sample point at an address is "significant (S)", "1" is stored in this S/N bit memory, and when the sample point is "non-significant (N)", "0" is stored. On the other hand, coefficient bit data is stored in a coefficient bit memory. When the code block has a size of 64×64 and number of bit planes is N, the coefficient bit memory has a size of 64×64×N bits.

In the bit-plane coding pass generator 14, the coefficient bit modeling is done independently for each bit plane by three kinds of coding passes in a direction from MSB toward LSB. At this time, the values of all addresses in the S/N bit memory are pre-initialized to "0", that is, to "non-significant (N)".

A bit plane Z with only coefficient bit data of "0" is taken as zero-bit plane and not processed by the three kinds of coding passes. Also, a first bit plane $Z_1$ in which coefficient bit data at any sample point is "1" is processed by CU pass. At this time, a sample point where coefficient bit data is "1" becomes "significant (S)", and "1" is set at an address, indicating the sample point, in the S/N bit memory. Next, a shift is made to a bit plane $Z_2$ one bit lower than the bit plane $Z_1$. The bit plane $Z_2$ is processed by the three kinds of coding passes in the order of SP, MR and CU, and then subsequent bit planes are processed one after another toward LSB.

In the first method, a plurality of S/N matching patterns is prepared to effect the SP pass processing at a higher speed. The "S/N matching pattern" refers to a "significant (S)" or "non-significant (N)" pattern of a related sample point when a sift can be made from a sample point to a next sample point to be processed by SP pass.

The S/N matching pattern will be briefly explained below with reference to FIGS. 9 and 10. It should be noted that in FIGS. 9 and 10, "S" and "s" indicate a "significant" sample point while "s" ORs with another "s". That is, at least one of the plurality of "s" should be "significant". Also, "N" indicates a "non-significant" sample point, and "X" indicates a sample point for which no consideration is given to whether it is "significant" or "non-significant". Further, an expediential number is appended at upper left in each sample point to indicate the position of the sample point.

Figure 9:
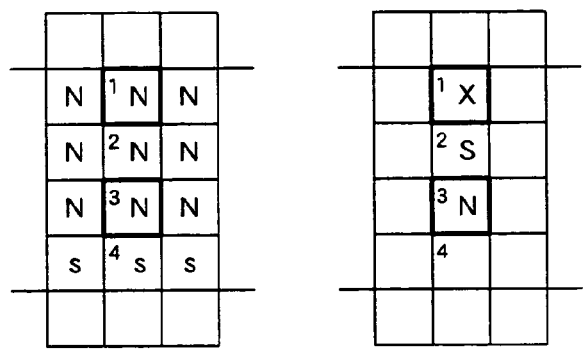
FIG. 9 shows an S/N matching pattern when in a bit-plane coding pass generator included in the image coder, a shift is made from a first sample to a third one.
Figure 10:
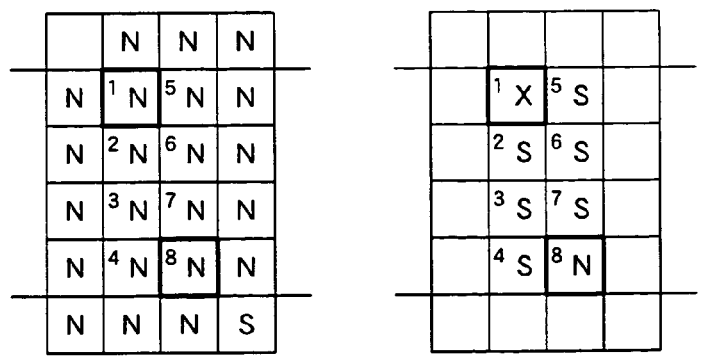
FIG. 10 shows an S/N matching pattern when in the bit-plane coding pass generator in FIG. 9, a shift is made from a first sample to an eighth one.

FIG. 9 shows an S/N matching pattern when a shift is made from the first sample to third one. The shift is allowed only when the first and third sample points meet the two patterns shown in FIG. 9. FIG. 10 shows an S/N matching pattern when a shift is made from the first sample to eighth one. The shift is possible only when the first and eighth samples meet the two patterns shown in FIG. 10.

A jump address value is set for each of the S/N matching patterns. In the S/N matching pattern shown in FIG. 9, the jump address value is "2" for the shift from the first sample to the third sample. In the S/N matching pattern shown in FIG. 10, the jump address value is "7" for the shift from the first sample to the eighth sample.

Namely, by presetting an S/N matching pattern for shift from an arbitrary sample point to a next sample point to be processed by SP pass, it is possible to know a jump-destination sample point from a jump address value obtained from a current S/N matching pattern.

Note that in this first method, there should also be prepared an S/N matching pattern for shift to a next sample point in the conventional order of scanning.

The number of S/N matching patterns to be prepared depends upon the size of an area to be searched at a time. In the following explanation, it is assumed that it is searched at a time whether there is a sample point to be processed by SP pass as a jump destination in an area of three samples in the horizontal direction and four samples in the vertical direction. In this case, a reference sample point has five samples in the horizontal direction and six samples in the vertical direction. Namely, one sample is added to each of the top and bottom and right and left of the area of 3×4 samples. It should be noted that when reference is made to outside he code block, processing is done on the assumption that there exists a "non-significant" sample point in the place of the code block.

As above, a first SP pass processing is done in the bit plane $Z_2$. A first SP pass processing is done in the bit plane $Z_2$ as above. To an area $AR_1$ of three samples in the horizontal direction and four samples in the vertical direction as shown in FIG. 11(A), there is loaded, from the S/N bit memory, S/N bit data of five samples in the horizontal direction and six samples in the vertical direction equivalent to the area $AR_1$ and its periphery in order to judge whether there exists a sample point to be processed by SP pass.

Each of the S/N matching patterns is exclusive. In case there is a sample point to be processed by SP pass in the area $AR_1$, an S/N matching pattern corresponds to the sample point, and a jump address value corresponding to the S/N matching pattern is outputted. FIG. 12 shows a table for outputting of the jump address value. In the example shown in FIG. 11(A), since a shift is made from the second sample A to the eleventh sample B, the jump address value is "9". Then, the sample point B to which the address jump has been made is processed by SP pass, and further, there is set a new area $AR_2$ in which the sample point B to which the address jump has been made is the left-end row. The above procedure is repeated. It should be noted that the area $AR_2$ is not limited to a one in which the sample point B to which address jump is made is the left-end row but may be a one starting with the sample point B.

On the other hand, if the area $AR_1$ has no sample point to be processed by SP pass, no S/N matching pattern will be coincident. In this case, to judge again whether there exists an sample point to be processed by SP pass, S/N bit data of five samples in the horizontal direction and six samples in the vertical direction, equivalent to an area $AR_3$ downstream of the area $AR_1$ as shown in FIG. 11(B) and its periphery, is loaded from the S/N bit memory to the area $AR_3$.

Figure 13:
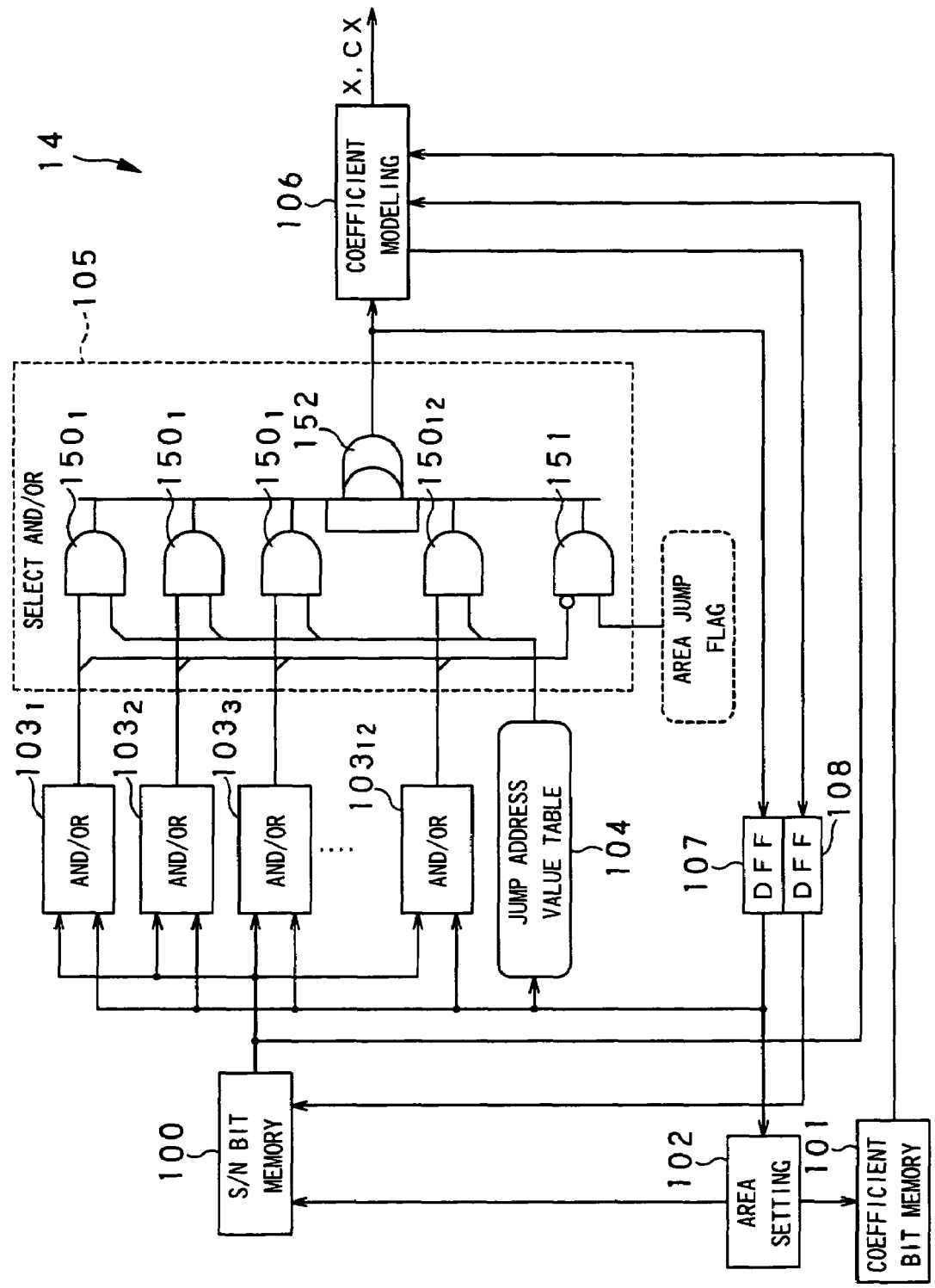
FIG. 13 schematically illustrates a SP pass processing-related part of the bit-plane coding pass generator in a first method.

FIG. 13 schematically illustrates the construction a part, related to the SP pass processing, of the bit-plane coding pass generator 14 in the first method having been described above. As shown in FIG. 13, the bit-plane coding pass generator 14 includes at least an S/N bit memory 100, coefficient bit memory 101, area setting circuit 102, AND/OR circuits $103_1$ to $103_{12}$ for the first to twelfth samples, jump address value table 104, selecting AND/OR circuit 105, coefficient modeling circuit 106, and DFFs (D flip-flop) 107 and 108.

In case the code block has a size of 64×64, the S/N bit memory 100 has a size of 64×64×1 bits as shown in FIG. 14.

In this S/N bit memory 100, "1" is set when the sample point at the address is "significant (S)", and "0" is set when the sample point is "non-significant (N)".

On the other hand, in case the code block size is 64×64 and number of bit planes is N, the coefficient bit memory 101 has a size of 64×64×N bits as shown in FIG. 15. The coefficient bit memory 101 stores coefficient bit data at the sample point.

Figure 16:
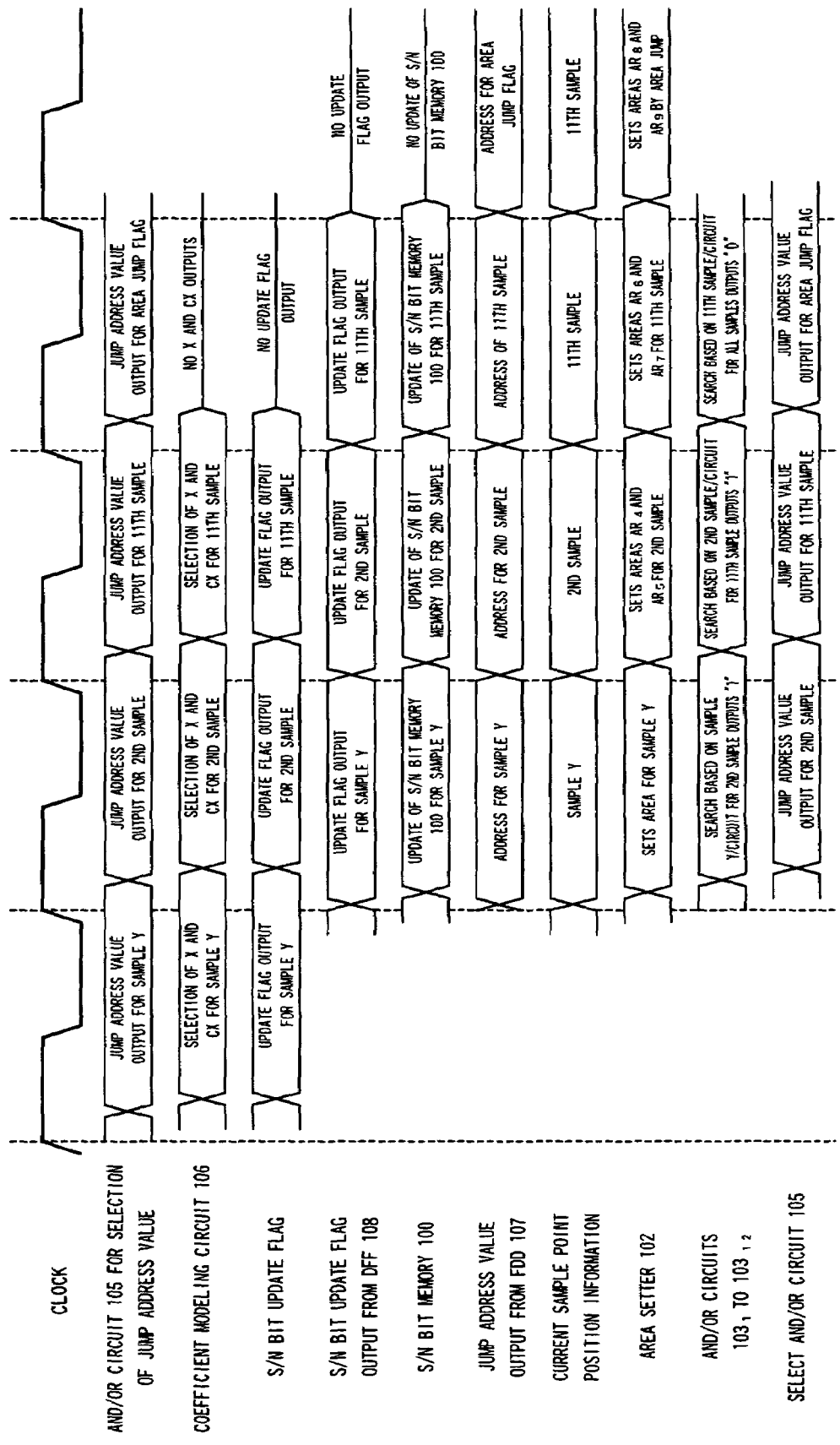
FIG. 16 is a timing chart of operations made in the bit-plane coding pass generator in the first method.

SP pass processing starting with a state inn which a jump from a sample point Y (not shown) to the second sample shown in FIGS. 14(A) and 15(A) has been decided will be described in detail below with reference to FIG. 13 and a timing chart shown in FIG. 16. It should be noted that in this example, it is searched whether a sample point to be processed by SP pass and which is a jump destination exists in an area of three samples in the horizontal direction and four samples in the vertical direction.

The selecting AND/OR circuit 105 supplies a jump address value for the second sample to the coefficient modeling circuit 106 and DFF 107.

Supplied with the jump address value for the second sample, the coefficient modeling circuit 106 processes the second sample by SP pass to calculate coefficient bit data X and context CX. When the coefficient bit data X of the second sample is "1", the coefficient modeling circuit 106 synchronizes with a processing clock in DFF 108, and then supplies "1" as an S/N bit update flag to the S/N bit memory 100. The S/N bit memory 100 will update the S/N bit for the second sample to "1" indicating a "significant (S)" state.

On the other hand, DFF 107 synchronizes the jump address value for the second sample supplied from the selecting AND/OR circuit 105 with the processing clock, and supplies the jump address value to the area setting circuit 102.

The area setting circuit 102 sets, based on the jump address value supplied from DFF 107, an area $AR_4$ (as shown in FIG. 14(A)) of five samples in the horizontal direction and six samples in the vertical direction and in which the second sample is at the second place from the left in the S/N bit memory 100, and also an area $AR_5$ (as shown in FIG. 15(A)) of three samples in the horizontal direction and four samples in the vertical direction and in which the second sample is at the left end in the coefficient bit memory 101.

The S/N bit memory 100 supplies S/N bit data in the set area $SR_4$ to the AND/OR circuits $103_1$ to $103_{12}$ and coefficient modeling circuit 106. Also, the coefficient bit memory 101 supplies coefficient bit data in the set area $SR_5$ to the coefficient modeling circuit 106.

The aforementioned DFF 107 synchronizes a jump address value for the second sample and supplies it as position information on the current sample point to the AND/OR circuits $103_1$ to $103_{12}$ and jump address value table 104.

The AND/OR circuits $103_1$ to $103_{12}$ judge, based on the position information on the current sample point, whether a jump can be made from the current sample point to each sample point positions.

Figure 17:
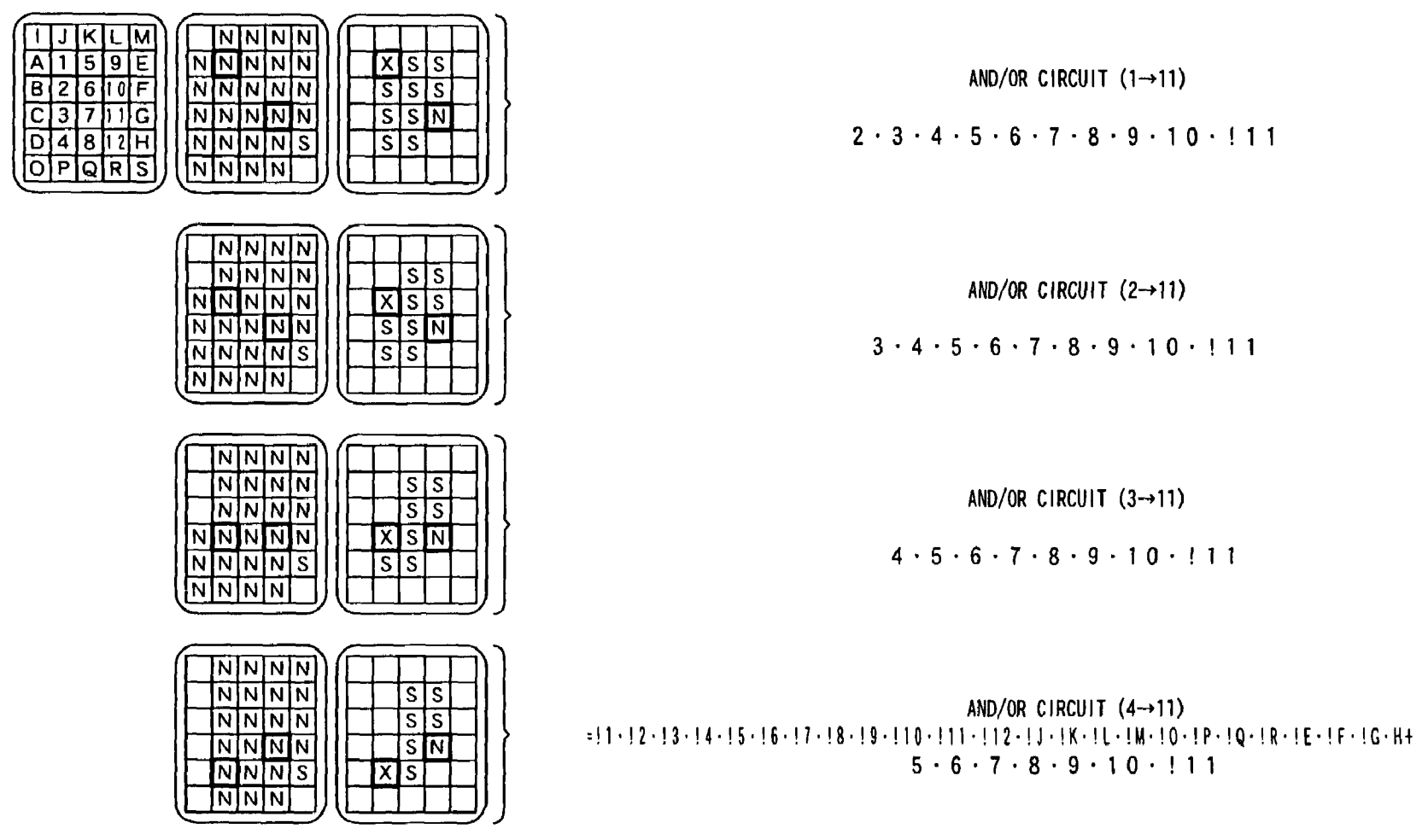

For example, the AND/OR circuit $103_{11}$ for the eleventh sample has ten types of AND/OR circuits including from an AND/OR circuit for judgment of whether a jump can be done from the first sample to eleventh one (1→11) to an AND/OR circuit for judgment of whether a jump can be done from the tenth sample to eleventh one (10→11). Each of the AND/OR circuits calculates a pattern matching logical formula as shown in FIG. 17 in order to judge whether the current S/N pattern coincides with the S/N matching pattern shown in FIG. 17. In the pattern matching logical formula, "." is AND, "+" is OR and "!" is NOT. Since the current sample point is the second sample, only the AND/OR circuit (2→11) is used to judge whether the current S/N pattern coincides with two types of S/N matching patterns shown in FIG. 17.

When there are found sample points to be processed by SP pass at the third to twelfth samples, any one of the AND/OR circuits $103_1$ to $103_{12}$ outputs "1". On the contrary, if there are no sample points to be processed by SP pass at the third to twelfth samples, all the AND/OR circuits $103_1$ to $103_{12}$ output "0".

Explanation will be made with reference to FIG. 13 again. In the selecting AND/OR circuit 105, each of the AND gates $150_1$ to $150_{12}$ is supplied at one terminal thereof with outputs from a corresponding one of the AND/OR circuits $103_1$ to $103_{12}$, respectively. Also, each of the AND gates $150_1$ to $150_{12}$ is supplied at the other terminal thereof with jump address value for a jump to the first to twelfth samples, set by the jump address value table 104 based on the position information on the current sample point. Therefore, when there are found sample points to be processed by SP pass at the third to twelfth samples and any one of the AND/OR circuits $103_1$ to $103_{12}$ outputs "1", the output from the AND/OR circuit in consideration is supplied to an OR gate 152 and also supplied as a jump address value to the aforementioned coefficient modeling circuit 106.

On the other had, in the selecting AND/OR circuit 105, an AND gate 151 is supplied at one terminal thereof with all outputs from the AND/OR circuits $103_1$ to $103_{12}$. The outputs are in an inverted form. Also, the AND gate 151 is supplied at the other terminal thereof with an area jump flag for a jump from one to another area. Therefore, in case no sample point to be processed by SP pass is found at the third to twelfth samples and all the AND/OR circuits $103_1$ to $103_{12}$ output "0", the AND gate 151 is turned on, so that the area jump flag is given to the OR gate 152 and also supplied as a jump address value to the aforementioned coefficient modeling circuit 106.

Explanation will be continued on the assumption that the eleventh sample has been found as a sample point to be processed by SP pass. In this case, the AND/OR circuit $103_{11}$ outputs "1" and the AND gate $150_{11}$ is turned on, so that the selecting AND/OR circuit 105 will supply an jump address value for the eleventh sample to the coefficient modeling circuit 106 and DFF 107 via the OR gate 152.

Supplied with the jump address value for the eleventh sample, the coefficient modeling circuit 106 processes the eleventh sample by SP pass to calculate the coefficient bit data X and context CX. When the coefficient bit data X on the eleventh sample is "1", the coefficient modeling circuit 106 supplies "1" as an S/N bit update flag to the S/N bit memory 100 via DFF 108, and the S/N bit memory 100 will update the S/N bit for an address corresponding to the eleventh sample to "1" which indicates a "significant (S)" state according to the supplied flag.

On the other hand, DFF 107 synchronizes the jump address value for the eleventh sample, supplied from the selecting AND/OR circuit 105, and supplies the jump address value to the area setting circuit 102.

The area setting circuit 102 sets, based on the jump address value supplied from DFF 107, an area $AR_6$ (as shown in FIG. 14(A)) of five samples in the horizontal direction and six samples in the vertical direction and in which the eleventh sample is at the second place from the left in the S/N bit memory 100, and also an area $AR_7$ (as shown in FIG. 15(A)) of three samples in the horizontal direction and four samples in the vertical direction and in which the eleventh sample is at the left end in the coefficient bit memory 101. As a result, the eleventh sample will have the number therefor changed to "three" as shown in FIGS. 14(B) and 15(B).

The S/N bit memory 100 supplies S/N bit data in the set area $SR_6$ to the AND/OF circuits $103_1$ to $103_{12}$ and coefficient modeling circuit 106. Also, the coefficient bit memory 101 supplies coefficient bit data in the set area $SR_7$ to the coefficient modeling circuit 106.

The aforementioned DFF 107 synchronizes a jump address value for the eleventh sample and supplies it as position information on the current sample point to the AND/OR circuits $103_1$ to $103_{12}$ and jump address value table 104.

When there are found sample points to be processed by SP pass at the fourth to twelfth samples, any one of the AND/OR circuits $103_4$ to $103_{12}$ outputs "1". On the contrary, if there are no sample points to be processed by SP pass at the fourth to twelfth samples, all the AND/OR circuits $103_4$ to $103_{12}$ output "0".

In the selecting AND/OR circuit 105, each of the AND gates $150_1$ to $150_{12}$ is supplied at one terminal thereof with outputs from a corresponding one of the AND/OR circuits $103_1$ to $103_{12}$, respectively. Also, each of the AND gates $150_1$ to $150_{12}$ is supplied at the other terminal thereof with jump address value for a jump to the first to twelfth samples, set by the jump address value table 104 based on the position information on the current sample point. Therefore, when there are found sample points to be processed by SP pass at the fourth to twelfth samples and any one of the AND/OR circuits $103_4$ to $103_{12}$ outputs "1", the output from the AND/OR circuit in consideration is supplied to the OR gate 152 and also supplied as a jump address value to the aforementioned coefficient modeling circuit 106.

On the other had, in the selecting AND/OR circuit 150, an AND gate 151 is supplied at one terminal thereof with all outputs from the AND/OR circuits $103_1$ to $103_{12}$. The outputs are in an inverted form. Also, the AND gate 151 is supplied at the other terminal thereof with an area jump flag for a jump from one to another area. Therefore, in case no sample point to be processed by SP pass is found at the fourth to twelfth samples and all the AND/OR circuits $103_4$ to $103_{12}$ output "0", all the outputs are inverted and supplied to the one terminal of the AND gate 151, the area jump flag is given to the OR gate 152 and also supplied as a jump address value to the aforementioned coefficient modeling circuit 106. Thus, the area setting circuit 102 sets a new sample area $AR_8$ (FIG. 14(B)) of five samples in the horizontal direction and six samples in the vertical direction in the S/N bit memory 100, and a new area $AR_9$ (FIG. 15(B)) of three samples in the horizontal direction and four samples in the vertical direction in the coefficient bit memory 101.

Note that when such an area jump has been made, the current sample point position will not be updated. To find a first sample point to be processed by SP pass in a desired area, each of the AND/OR circuits $103_1$ to $103_1$ judges whether each of sample points is the first sample point to be processed by SP pass.

Figure 18:
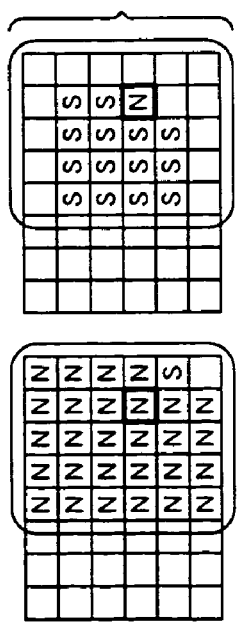
FIG. 18 explains a pattern matching made in an AND/OR circuit for the eleventh sample after a jump from one to another area.

For example, the AND/OR circuit $103_{11}$ for the eleventh sample calculates a pattern matching logical formula as shown in FIG. 18 to judge whether the current S/N pattern coincides with an S/N matching pattern shown in FIG. 18.

As having been described in the foregoing, in case a sample point to be processed by SP pass is in a search area, the first method permits to jump to the sample for processing by SP pass and thus omit the operations for other sample points not to be processed by SP pass. So, the first method permits to reduce the number of operation cycles or the time required for the operation as compared with those in the operations in the order of scanning. Also, the first method allows the apparatus to operate with a reduced clock frequency, whereby it is possible to provide a lower power consumption hardware.

Next, the second method will be described. Also in this technique, an S/N bit memory is prepared which indicates the "significant (S)" or "non-significant (N)" state of each sample point in a code block. On the other hand, coefficient bit data is stored in a coefficient bit memory.

As having previously been described, the coefficient bit modeling in the bit-plane coding pass generator 14 is done independently for each bit plane by three kinds of coding passes in a direction from MSB toward LSB. At this time, the values of all addresses in the S/N bit memory are pre-initialized to "0", that is, to "non-significant (N)".

A bit plane Z with only coefficient bit data of "0" is taken as zero-bit plane and not processed by the three kinds of coding passes. Also, a first bit plane $Z_1$ in which coefficient bit data at any sample point is "1" is processed by CU pass. At this time, a sample point where coefficient bit data is "1" becomes "significant (S)", and "1" is set at an address, indicating the sample point, in the S/N bit memory. Next, a shift is made to a bit plane $Z_2$ one bit lower than the bit plane $Z_1$. The bit plane $Z_2$ is processed by the three kinds of coding passes in the order of SP, MR and CU, and then subsequent bit planes are processed one after another toward LSB.

In the second method, S/N matching patterns are prepared for samples in a search area to effect the SP pass processing at a higher speed. In the S/N matching pattern for each of sample points, there is set a corresponding jump address value. Different from the "S/N matching pattern" in the aforementioned first method, the "S/N matching pattern" in the second method refers to a "significant (S)" or "non-significant (N)" pattern at an arbitrary sample point and its periphery to judge whether the arbitrary sample point is a one to be processed by SP pass. More specifically, "non-significant" sample points near "8" and of which at least one is "significant" are to be processed by SP pass as shown in FIG. 19. It should be noted that in FIG. 19, "s" indicate a "significant" sample point and ORs with another "s". Also, "N" indicates a "non-significant" sample point.

In the second method, coincidence or non-coincidence of each sample point with the S/N matching pattern is examined to judge whether there exists a sample point to be processed by SP pass. In the priority encoder, of sample points found coincident with the S/N matching pattern, a one nearest in the order of scanning to the current sample point is selected as a next sample point to be processed by SP pass.

The number of S/N matching patterns to be prepared depends upon the size of an area to be searched at a time. In the following explanation, it is assumed that it is searched at a time whether there is a sample point to be processed by SP pass as a jump destination in an area of three samples in the horizontal direction and four samples in the vertical direction. In this case, a reference sample point has five samples in the horizontal direction and six samples in the vertical direction. Namely, one sample is added to each of the top and bottom and right and left of the area of 3×4 samples. It should be noted that when reference is made to outside he code block, processing is done on the assumption that there exists a "non-significant" sample point in the place of the code block.

As above, a first SP pass processing is done in the bit plane $Z_2$. First, to an area $AR_{10}$ of three samples in the horizontal direction and four samples in the vertical direction as shown in FIG. 20(A), there is loaded, from the S/N bit memory, S/N bit data of five samples in the horizontal direction and six samples in the vertical direction equivalent to the area $AR_{10}$ and its periphery in order to judge whether there exists a sample point to be processed by SP pass.

Then, it is checked whether each of sample points in the area $AR_{10}$ is coincident with the aforementioned S/N matching patter to judge whether it is to be processed by SP pass. In case there is found a sample point to be processed by SP pass in the area $AR_{10}$, the priority encoder outputs the address of a sample point nearest in the order of scanning to the current sample point as a jump address value.

Note that the present invention is not limited the above example in which the priority encoder outputs the address of a sample point nearest in the order of scanning to the current sample point as a jump address value, but the priority encoder may be adapted to take the address as a next sample point and output a jump address value obtained with reference to the jump address value table 104 shown in FIG. 12.

FIGS. 21(A) and 21(B) show the relations between positions of coincidence and non-coincidence with the S/N matching pattern and the priority encoder outputs when the current sample points are the first and fifth samples. In FIG. 21, "○" indicates a position of coincidence, "×" indicates a position of non-coincidence, "−" indicates a sample point for which no consideration is given to whether it is "significant" or "non-significant", and "PE out" indicates a jump address value output from the priority encoder.

In the example shown in FIG. 20(A), since the fifth sample N and eleventh sample C coincide with the S/N matching pattern when the current sample point is the second sample A, the priority encoder outputs a jump address value of "5". Then, the sample point B to which the address jump has been made is processed by SP pass, and further, there is set a new area $AR_{11}$ in which the sample point B to which the address jump has been made is the left-end row. The above procedure is repeated. It should be noted that the area $AR_{11}$ is not limited to a one in which the sample point B to which address jump is made is the left-end row but may be a one starting with the sample point B.

On the other hand, if the area $AR_{10}$ has no sample point to be processed by SP pass, no S/N matching pattern will be coincident. In this case, to judge again whether there exists an sample point to be processed by SP pass, S/N bit data of five samples in the horizontal direction and six samples in the vertical direction, equivalent to an area $AR_{12}$ downstream of the area $AR_{10}$ as shown in FIG. 20(B) and its periphery, is loaded from the S/N bit memory to the area $AR_{12}$.

Figure 22:
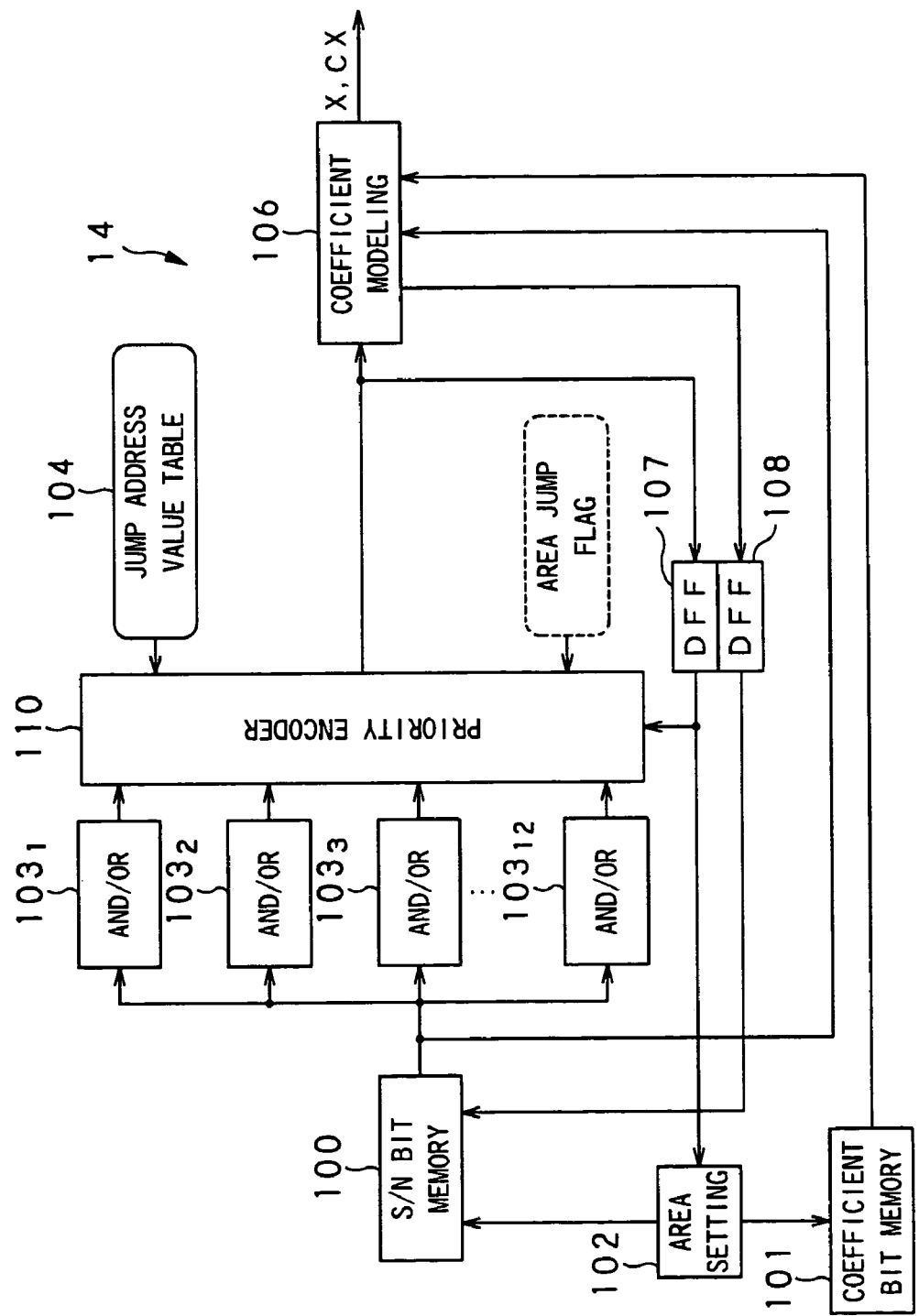
FIG. 22 schematically illustrates the construction of an SP pass processing-related part of the bit-plane coding pass generator in FIG. 9 for effecting the second method.

FIG. 22 schematically illustrates the construction a part, related to the SP pass processing, of the bit-plane coding pass generator 14 in the second method having been described above. As shown in FIG. 22, the bit-plane coding pass generator 14 includes at least an S/N bit memory 100, coefficient bit memory 101, area setting circuit 102, AND/OR circuits $103_1$ to $103_{12}$ for the first to twelfth samples, jump address value table 104, coefficient modeling circuit 106, DFFs (D flip-flop) 107 and 108 and a priority encoder 110.

In case the code block has a size of 64×64, the S/N bit memory 100 has a size of 64×64×1 bits as shown in FIG. 23. In this S/N bit memory 100, "1" is set when the sample point at the address is "significant (S)", and "0" is set when the sample point is "non-significant (N)".

On the other hand, in case the code block size is 64×64 and number of bit planes is N, the coefficient bit memory 101 has a size of 64×64×N bits as shown in FIG. 24. The coefficient bit memory 101 stores coefficient bit data at the sample point.

Figure 25:
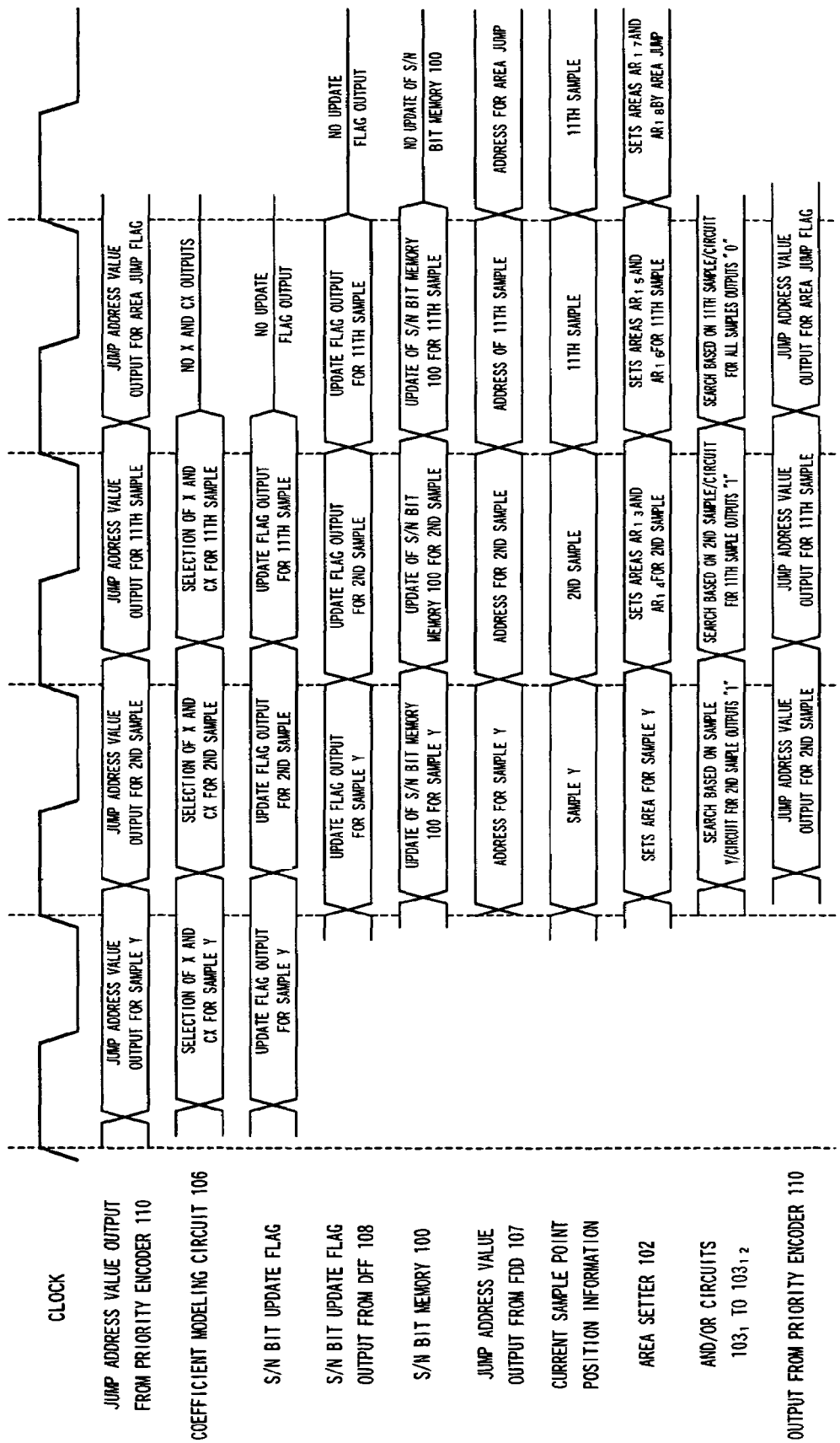
FIG. 25 shows a timing chart of operations made in the bit-plane coding pass generator for effecting the first method.

SP pass processing starting with a state inn which a jump from a sample point Y (not shown) to the second sample shown in FIGS. 23(A) and 24(A) has been decided will be described in detail below with reference to FIG. 22 and a timing chart shown in FIG. 25. It should be noted that in this example, it is searched whether a sample point to be processed by SP pass and which is a jump destination exists in an area of three samples in the horizontal direction and four samples in the vertical direction.

The priority encoder 110 supplies a jump address value for the second sample to the coefficient modeling circuit 106 and DFF 107.

Supplied with the jump address value for the second sample, the coefficient modeling circuit 106 processes the second sample by SP pass to calculate coefficient bit data X and context CX. When the coefficient bit data X of the second sample is "1", the coefficient modeling circuit 106 synchronizes with a processing clock in DFF 108, and then supplies "1" as an S/N bit update flag to the S/N bit memory 100. The S/N bit memory 100 will update the S/N bit for the second sample to "1" indicating a "significant (S)" state.

On the other hand, DFF 107 synchronizes the jump address value for the second sample supplied from the priority encoder 110 with the processing clock, and supplies the jump address value to the area setting circuit 102.

The area setting circuit 102 sets, based on the jump address value supplied from DFF 107, an area $AR_{13}$ (as shown in FIG. 23(A)) of five samples in the horizontal direction and six samples in the vertical direction and in which the second sample is at the second place from the left in the S/N bit memory 100, and also an area $AR_{13}$ (as shown in FIG. 24(A)) of three samples in the horizontal direction and four samples in the vertical direction and in which the second sample is at the left end in the coefficient bit memory 101.

The S/N bit memory 100 supplies S/N bit data in the set area $SR_{13}$ to the AND/OR circuits $103_1$ to $103_{12}$ and coefficient modeling circuit 106. Also, the coefficient bit memory 101 supplies coefficient bit data in the set area $SR_{14}$ to the coefficient modeling circuit 106.

The aforementioned DFF 107 synchronizes a jump address value for the second sample and supplies it as position information on the current sample point to the priority encoder 110.

The AND/OR circuits $103_1$ to $103_{12}$ judge, by checking whether each of the sample points coincides with the S/N matching pattern, whether it is a sample point to be processed by SP pass. For example, each of the AND/OR circuits for the first, fourth, seventh and eleventh samples a pattern matching logical formula as shown in FIG. 26 in order to judge whether the current S/N pattern coincides with the S/N matching pattern shown in FIG. 26. In the pattern matching logical formula, "." is AND, "+" is OR and "!" is NOT.

When there are found sample points to be processed by SP pass at the first to twelfth samples, any one of the AND/OR circuits $103_1$ to $103_{12}$ outputs "1". On the contrary, if there is no sample points to be processed by SP pass at the third to twelfth samples, all the AND/OR circuits $103_1$ to $103_{12}$ output "0".

Explanation will be made with reference to FIG. 22 again. The priority encoder 110 is supplied with outputs from the AND/OR circuits $103_1$ to $103_{12}$ as well as with position information on the current sample point. When there are found sample points to be processed by SP pass at the third to twelfth samples and any one of the AND/OR circuits $103_3$ to $103_{12}$ outputs "1", the address of one of the sample points, nearest in the order of scanning to the current sample point is supplied as a jump address value to the aforementioned coefficient modeling circuit 106.

On the other had, the priority encoder 110 is supplied also with an area jump flag for a jump from one to another area. In case no sample points to be processed by SP pass are found at the third to twelfth samples and all the AND/OR circuits $103_1$ to $103_{12}$ output "0" or only the AND/OR circuit $103_1$ outputs "1", the area jump flag is supplied as a jump address value to the aforementioned coefficient modeling circuit 106.

Explanation will be continued on the assumption that the eleventh sample has been found as a sample point to be processed by SP pass. In this case, the AND/OR circuit $103_{11}$ outputs "1" and the priority encoder 110 will supply an jump address value for the eleventh sample to the coefficient modeling circuit 106 and DFF 107.

Supplied with the jump address value for the eleventh sample, the coefficient modeling circuit 106 processes the eleventh sample by SP pass to calculate the coefficient bit data X and context CX. When the coefficient bit data X on the eleventh sample is "1", the coefficient modeling circuit 106 supplies "1" as an S/N bit update flag to the S/N bit memory 100 via DFF 108, and the S/N bit memory 100 will update the S/N bit for an address corresponding to the eleventh sample to "1" which indicates a "significant (S)" state according to the supplied flag.

On the other hand, DFF 107 synchronizes the jump address value for the eleventh sample, supplied from the selecting AND/OR circuit 105, and supplies the jump address value to the area setting circuit 102.

The area setting circuit 102 sets, based on the jump address value supplied from DFF 107, an area $AR_{15}$ (as shown in FIG. 23(A)) of five samples in the horizontal direction and six samples in the vertical direction and in which the eleventh sample is at the second place from the left in the S/N bit memory 100, and also an area $AR_{16}$ (as shown in FIG. 24(A)) of three samples in the horizontal direction and four samples in the vertical direction and in which the eleventh sample is at the left end in the coefficient bit memory 101. As a result, the eleventh sample will have the number therefor changed to "three" as shown in FIGS. 23(B) and 24(B).

The S/N bit memory 100 supplies S/N bit data in the set area $SR_{15}$ to the AND/OR circuits $103_1$ to $103_{12}$ and coefficient modeling circuit 106. Also, the coefficient bit memory 101 supplies coefficient bit data in the set area $SR_{16}$ to the coefficient modeling circuit 106.

The aforementioned DFF 107 synchronizes a jump address value for the eleventh sample and supplies it as position information on the current sample point to the priority encoder 110.

When there are sample points to be processed by SP pass are found at the first to twelfth samples, any one of the AND/OR circuits $103_1$ to $103_{12}$ outputs "1". On the contrary, if there are no sample points to be processed by SP pass at the first to twelfth samples, all the AND/OR circuits $103_1$ to $103_{12}$ output "0".

As above, the priority encoder 110 is supplied with outputs from the AND/OR circuits $103_1$ to $103_{12}$ as well as with position information on the current sample point. Therefore, when there are found sample points to be processed by SP pass at the fourth to twelfth samples and any one of the AND/OR circuits $103_4$ to $103_{12}$ outputs "1", the address of one of the sample points, nearest in the order of scanner to the current sample point is supplied as a jump address value to the aforementioned coefficient modeling circuit 106.

On the other had, the priority encoder 110 is also supplied with an area jump flag for a jump from one to another area. In case no sample point to be processed by SP pass is found at any of the fourth to twelfth samples and all the AND/OR circuits $103_4$ to $103_{12}$ output "0" or only the AND/OR circuits $103_1$ and $103_2$ output "1", the area jump flag is given as a jump address value to the aforementioned coefficient modeling circuit 106. Thus, the area setting circuit 102 sets a new sample area $AR_{17}$ (FIG. 23(B)) of five samples in the horizontal direction and six samples in the vertical direction in the S/N bit memory 100, and a new area $AR_{18}$ (FIG. 24(B)) of three samples in the horizontal direction and four samples in the vertical direction in the coefficient bit memory 101.

As having been described in the foregoing, in case a sample point to be processed by SP pass is found in a search area, the second method permits to jump to the sample point for processing by SP pass and thus omit the operations for other sample points not to be processed by SP pass. So, the second method permits to reduce the number of operation cycles or the time required for the operation as compared with those in the operations in the order of scanning. Also, the second method allows the apparatus to operate with a reduced clock frequency, whereby it is possible to provide a lower power consumption hardware.

In the foregoing, the present invention has been described in detail concerning certain preferred embodiments thereof as examples with reference to the accompanying drawings. However, it should be understood by those ordinarily skilled in the art that the present invention is not limited to the embodiments but can be modified in various manners, constructed alternatively or embodied in various other forms without departing from the scope and spirit thereof as set forth and defined in the appended claims.

The embodiment of the image coder according to the present invention has been described as a hardware. However, the present invention is not limited to the image code as a hardware, but the image coding can be done by allowing a CPU (central processing unit) to execute a computer program for the image coding. In this case, the computer program can be distributed as a recording medium having the program recorded therein. Also, the computer program can be distributed by transmission over any other transmission medium.

As having been described in detail above, the image coder according to the present invention includes a wavelet transform means for dividing an input image into subbands by wavelet transform; a code block generating means for dividing each of the subbands generated by the wavelet transform means into code blocks each of a predetermined size; a bit plane generating means for generating a bit plane including from a most significant bit to least significant bit in units of the code block; a coding pass processing means for processing each of sample points in the bit plane by any of a plurality of coding passes; and an arithmetic coding means for making arithmetic coding according to results of the coding pass processing; the coding pass processing means reading, from a storage means, significance ant/non-significance information indicating whether sample points in an area including the position of a sample point being currently processed and which is occupied by a predetermined number of samples, and those existing around the area, are significant or non-significant, and making a parallel comparison between the significance/non-significance information and a plurality of preset matching patterns, thereby detecting a next sample point to be processed.

Also, the image coder including according to the present invention includes a wavelet transform means for dividing an input image into subbands by wavelet transform; a code block generating means for dividing each of the subbands generated by the wavelet transform means into code blocks each of a predetermined size; a bit plane generating means for generating a bit plane including from a most significant bit to least significant bit in units of the code block; a coding pass processing means for processing each of sample points in the bit plane by any of a plurality of coding passes; and an arithmetic coding means for making arithmetic coding according to results of the coding pass processing;

the coding pass processing means reading, from a storage means, significance ant/non-significance information indicating whether sample points in the bit plane and those around them are significant or non-significant, and making a parallel comparison between the significance/non-significance information and a plurality of preset matching patterns, thereby detecting, as a next sample point to be processed, a one, nearest to the position of a sample point being currently processed, of the sample points having been determined, as the result of the comparison, to fit any of the plurality of matching patterns.

In the above image coders according to the present invention, for processing each of sample points in a bit plate by the significance propagation (SP) pass defined in JPEG-2000 for example, there is read, from a storage means, significance ant/non-significance information indicating whether sample points in an area including the position of a sample point being currently processed and which is occupied by a predetermined number of samples and those existing around the area, are significant or non-significant and a parallel comparison is made between the significance/non-significance information and a plurality of preset matching patterns, or there is read, from a storage means, significance ant/non-significance information indicating whether sample points in the bit plane and those around them are significant or non-significant, and a parallel comparison is made between the significance/non-significance information and a plurality of preset matching patterns. In case there is found, as a result of the comparison, a sample point to be processed by the SP pass in an area under search, jump is made to that sample point for SP pass processing and sample points not be to be processed by the SP pass are not so processed. Thus, the present invention permits to reduce the number of operation cycles or the time required for the operation as compared with those in the operations in the order of scanning.

Also, the image coding method according to the present invention includes the steps of dividing an input image into subbands by wavelet transform; dividing each of the subbands generated in the wavelet transform step into code blocks each of a predetermined size; generating a bit plane including from a most significant bit to least significant bit in units of the code block; processing each of sample points in the bit plane by any of a plurality of coding passes; and making arithmetic coding according to results of the coding pass processing; in the coding pass processing, there being read, from a storage means, significance ant/non-significance information indicating whether sample points in an area including the position of a sample point being currently processed and which is occupied by a predetermined number of samples, and those existing around the area, are significant or non-significant, and a parallel comparison being made between the significance/non-significance information and a plurality of preset matching patterns, thereby detecting a next sample point to be processed.

Also, the image coding method according to the present invention includes the steps of dividing an input image into subbands by wavelet transform; dividing each of the subbands generated in the wavelet transform step into code blocks each of a predetermined size; generating a bit plane including from a most significant bit to least significant bit in units of the code block; processing each of sample points in the bit plane by any of a plurality of coding passes; and making arithmetic coding according to results of the coding pass processing; in the coding pass processing means, there being read, from a storage means, significance ant/non-significance information indicating whether sample points in the bit plane and those around them are significant or non-significant, and a parallel comparison being made between the significance/non-significance information and a plurality of preset matching patterns, thereby detecting, as a next sample point to be processed, a one, nearest to the position of a sample point being currently processed, of the sample points having been determined, as the result of the comparison, to fit any of the plurality of matching patterns.

In the above image coding method according to the present invention, for processing each of sample points in a bit plate by the significance propagation (SP) pass defined in JPEG-2000 for example, there is read, from a storage means, significance ant/non-significance information indicating whether sample points in an area including the position of a sample point being currently processed and which is occupied by a predetermined number of samples and those existing around the area, are "significant" or "non-significant" and a parallel comparison is made between the significance/non-significance information and a plurality of preset matching patterns, or there is read, from a storage means, significance ant/non-significance information indicating whether sample points in the bit plane and those around them are "significant" or "non-significant", and a parallel comparison is made between the significance/non-significance information and a plurality of preset matching patterns. In case there is found, as a result of the comparison, a sample point to be processed by the SP pass in an area under search, jump is made to that sample point for SP pass processing and sample points not be to be processed by the SP pass are not so processed. Thus, the present invention permits to reduce the number of operation cycles or the time required for the operation as compared with those in the operations in the order of scanning.

Also, the program according to the present invention allows a computer to execute the above-mentioned image coding, and the recording medium having the program recorded therein according to the present invention is a computer-readable one.

The above program and recording medium permit to implement the image coding by a software.

What is claimed is:

1. An image coding apparatus comprising:
   a wavelet transform means for dividing an input image into subbands by wavelet transform;
   a code block generating means for dividing each of the subbands generated by the wavelet transform means into code blocks each of a predetermined size;
   a bit plane generating means for generating a bit plane including from a most significant bit to least significant bit in units of the code block;

a coding pass processing means for processing each of sample points in the bit plane by any of a plurality of coding passes; and an arithmetic coding means for making arithmetic coding according to results of the coding pass processing;

the coding pass processing means reading, from a storage means, significance/non-significance information indicating whether sample points in an area including the position of a sample point being currently processed and which is occupied by a predetermined number of samples, and those existing around the area, are significant or non-significant, and making a parallel comparison between the significance/non-significance information and a plurality of preset matching patterns, thereby detecting a next sample point to be processed.

2. The apparatus as set forth in claim 1, wherein: the matching patterns indicate significant or non-significant patterns at the plurality of sample points, respectively, when a jump can be made from the position of an arbitrary sample point to the position of a next sample point to be processed; and the coding pass processing means detects a sample point to which a jump can be made from the position of a sample point being currently processed by making a parallel comparison between the significance/non-significance information in an area including the position of a sample point being currently processed and which is occupied by a predetermined number of samples and those existing around the area and the plurality of matching patterns.

3. The apparatus as set forth in claim 1, wherein: the matching patterns have jump address values set therein, respectively; and the coding pass processing means detects a next to-be-processed sample point according to the jump address value set in any one of the matching patterns compared with the significance/non-significance information and that is found to coincide with the latter.

4. The apparatus as set fourth in claim 3, wherein when there is found no coincidence between the significance/non-significance information and the plurality of matching patterns as the result of the comparison them, the coding pass processing means sets a new area having the predetermined number of samples, reads, from the storage means, new significance/non-significance information indicating whether the sample points in the new area and those around the area, and makes a parallel comparison between the new significance/non-significance information and the preset plurality of matching patterns.

5. The apparatus as set fourth in claim 1, wherein the significance/non-significance information is pre-initialized to "non-significant" for each code block.

6. An image coding apparatus including comprising:
a wavelet transform means for dividing an input image into subbands by wavelet transform;
a code block generating means for dividing each of the subbands generated by the wavelet transform means into code blocks each of a predetermined size;
a bit plane generating means for generating a bit plane including from a most significant bit to least significant bit in units of the code block;
a coding pass processing means for processing each of sample points in the bit plane by any of a plurality of coding passes;
and an arithmetic coding means for making arithmetic coding according to results of the coding pass processing;
the coding pass processing means reading, from a storage means, significance/non-significance information indicating whether sample points in the bit plane and those around them are significant or non-significant, and making a parallel comparison between the significance/non-significance information and a plurality of preset matching patterns, thereby detecting, as a next sample point to be processed, a one, nearest to the position of a sample point being currently processed, of the sample points having been determined, as the result of the comparison, to fit any of the plurality of matching patterns.

7. The apparatus as set fourth in claim 6, wherein when there is found no sample point showing a coincidence between significance/non-significance information and the plurality of matching patterns, the coding pass processing means sets a new area having the predetermined number of samples, reads, from the storage means, new significance/non-significance information indicating whether the sample points in the new area and those around the area, and makes a parallel comparison between the new significance/non-significance information and the preset plurality of matching patterns.

8. The apparatus as set fourth in claim 6, wherein the significance/non-significance information is pre-initialized to "non-significant" for each code block.

9. An image coding method comprising:
dividing an input image into subbands by wavelet transform;
dividing each of the subbands generated in the wavelet transform step into code blocks each of a predetermined size;
generating a bit plane including from a most significant bit to least significant bit in units of the code block;
processing each of sample points in the bit plane by any of a plurality of coding passes; and
making arithmetic coding according to results of the coding pass processing; in the coding pass processing, there being read, from a storage means, significance/non-significance information indicating whether sample points in an area including the position of a sample point being currently processed and which is occupied by a predetermined number of samples, and those existing around the area, are significant or non-significant, and a parallel comparison being made between the significance/non-significance information and a plurality of preset matching patterns, thereby detecting a next sample point to be processed.

10. An image coding method comprising:
dividing an input image into subbands by wavelet transform;
dividing each of the subbands generated in the wavelet transform step into code blocks each of a predetermined size;
generating a bit plane including from a most significant bit to least significant bit in units of the code block;
processing each of sample points in the bit plane by any of a plurality of coding passes; and
making arithmetic coding according to results of the coding pass processing; in the coding pass processing means, there being read, from a storage means, significance/non-significance information indicating whether sample points in the bit plane and those around them are significant or non-significant, and a parallel comparison being made between the significance/non-significance information and a plurality of preset matching patterns, thereby detecting, as a next sample point to be processed, a one, nearest to the position of a sample point being currently processed, of the sample points having been determined, as the result of the comparison, to fit any of the plurality of matching patterns.

11. A computer-readable recording medium including computer program instructions, which cause a computer to implement a method of image coding, comprising:

dividing an input image into subbands by wavelet transform;

dividing each of the subbands generated in the wavelet transform step into code blocks each of a predetermined size;

generating a bit plane including from a most significant bit to least significant bit in units of the code block;

processing each of sample points in the bit plane by any of a plurality of coding passes; and making arithmetic coding according to results of the coding pass processing; in the coding pass processing, there being read, from a storage means, significance/non-significance information indicating whether sample points in an area including the position of a sample point being currently processed and which is occupied by a predetermined number of samples, and those existing around the area, are significant or non-significant, and a parallel comparison being made between the significance/non-significance information and a plurality of preset matching patterns, thereby detecting a next sample point to be processed.

12. A computer-readable recording medium including computer program instructions, which cause a computer to implement a method of image coding, comprising:

dividing an input image into subbands by wavelet transform;

dividing each of the subbands generated in the wavelet transform step into code blocks each of a predetermined size;

generating a bit plane including from a most significant bit to least significant bit in units of the code block;

processing each of sample points in the bit plane by any of a plurality of coding passes; and making arithmetic coding according to results of the coding pass processing; in the coding pass processing means, there being read, from a storage means, significance/non-significance information indicating whether sample points in the bit plane and those around them are significant or non-significant, and a parallel comparison being made between the significance/non-significance information and a plurality of preset matching patterns, thereby detecting, as a next sample point to be processed, a one, nearest to the position of a sample point being currently processed, of the sample points having been determined, as the result of the comparison, to fit any of the plurality of matching patterns.

13. An image coding apparatus comprising:

a wavelet transform unit configured to divide an input image into subbands by a wavelet transforming unit;

a code block generating unit configured to divide each of the subbands generated by the wavelet transforming unit into code blocks each of a predetermined size;

a bit plane generating unit configured to generate a bit plane including from a most significant bit to least significant bit in units of the code block;

a coding pass processing unit configured to process each of sample points in the bit plane by any of a plurality of coding pass units; and an arithmetic coding unit configured to make arithmetic coding according to results of the coding pass processing;

the coding pass processing unit reading, from a storage unit, significance/non-significance information indicating whether sample points in an area including the position of a sample point being currently processed and which is occupied by a predetermined number of samples, and those existing around the area, are significant or non-significant, and configured to make a parallel comparison between the significance/non-significance information and a plurality of preset matching patterns, thereby detecting a next sample point to be processed.

14. An image coding apparatus including comprising:

a wavelet transform unit configured to divide an input image into subbands by a wavelet transforming unit;

a code block generating unit configured to divide each of the subbands generated by the wavelet transforming unit into code blocks each of a predetermined size;

a bit plane generating unit configured to generate a bit plane including from a most significant bit to least significant bit in units of the code block;

a coding pass processing unit configured to process each of sample points in the bit plane by any of a plurality of coding pass units;

and an arithmetic coding unit configured to make arithmetic coding according to results of the coding pass processing;

the coding pass processing unit reading, from a storage unit, significance/non-significance information indicating whether sample points in the bit plane and those around them are significant or non-significant, and making a parallel comparison between the significance/non-significance information and a plurality of preset matching patterns, thereby detecting, as a next sample point to be processed, a one, nearest to the position of a sample point being currently processed, of the sample points having been determined, as the result of the comparison, to fit any of the plurality of matching patterns.

* * * * *

UNITED STATES PATENT AND TRADEMARK OFFICE
CERTIFICATE OF CORRECTION

PATENT NO. : 7,224,846 B2  Page 1 of 1
APPLICATION NO. : 10/625520
DATED : May 29, 2007
INVENTOR(S) : Shigeo Fujishiro et al.

It is certified that error appears in the above-identified patent and that said Letters Patent is hereby corrected as shown below:

Column 3, Line 38, change "cording" to --coding--.

Column 12, Line 19, change "he" to --the--.

Column 13, Line 9, change "inn" to --in--.

Column 13, Line 55, change "$103_{12}$judge" to --$103_{12}$ judge--

Column 15, Line 7, change "OF" to --OR--.

Column 15, Line 57, change "$103_1$judges" to --$103_{12}$ judges--.

Column 16, Line 62, change "he" to --the--.

Column 17, Line 14, change "limited the" to --limited to the--.

Column 23, Line 36, change "fourth" to --forth--.

Column 23, Line 47, change "fourth" to --forth--.

Column 24, Line 10, change "fourth" to --forth--.

Column 24, Line 21, change "fourth" to --forth--.

Signed and Sealed this

Thirteenth Day of November, 2007

JON W. DUDAS
*Director of the United States Patent and Trademark Office*